(12) United States Patent
Kim et al.

(10) Patent No.: US 11,552,118 B2
(45) Date of Patent: Jan. 10, 2023

(54) IMAGE SENSOR INCLUDING A DOUBLE-SIDED SPHERICAL LENS

(71) Applicant: SAMSUNG ELECTRONICS CO., LTD., Suwon-si (KR)

(72) Inventors: Sanghoon Kim, Seongnam-si (KR); Yunki Lee, Hwaseong-si (KR); Hyeongdong Jo, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 194 days.

(21) Appl. No.: 16/945,965

(22) Filed: Aug. 3, 2020

(65) Prior Publication Data
US 2021/0193721 A1    Jun. 24, 2021

(30) Foreign Application Priority Data
Dec. 24, 2019    (KR) .................. 10-2019-0174287

(51) Int. Cl.
*H01L 27/146*    (2006.01)
*G01J 1/04*    (2006.01)
(Continued)

(52) U.S. Cl.
CPC ...... *H01L 27/14627* (2013.01); *G01J 1/0411* (2013.01); *G01J 1/0488* (2013.01);
(Continued)

(58) Field of Classification Search
CPC ......... H01L 27/14627; H01L 27/14621; H01L 27/14636; H01L 27/1464; H01L 27/14645;
(Continued)

(56) References Cited

U.S. PATENT DOCUMENTS 9,823,439 B2   11/2017 Hashimoto et al.
10,269,847 B2   4/2019 Parks
(Continued)

FOREIGN PATENT DOCUMENTS

JP    2010-245129    10/2010
KR    10-0967744    6/2010

OTHER PUBLICATIONS

D. Demolder, "Canon applies to patent double-sided micro lenses designed for better edge performance", Aug. 22, 2016, pp. 1-6.
(Continued)

*Primary Examiner* — Jennifer D Bennett
*Assistant Examiner* — Erin R Garber
(74) *Attorney, Agent, or Firm* — F. Chau & Associates, LLC

(57) ABSTRACT

An image sensor including: a substrate which has a first surface and a second surface opposite to the first surface and pixels arranged in a two-dimensional array, wherein each of the pixels includes a photodiode; a multi-wiring layer arranged on the first surface of the substrate; a color filter layer arranged on the second surface of the substrate and including color filters that respectively correspond to the pixels; and a lens layer arranged on the color filter layer and including a double-sided spherical lens, wherein the double-sided spherical lens includes at least two material layers having different refractive indexes.

16 Claims, 32 Drawing Sheets

(51) Int. Cl.
*G01J 1/44* (2006.01)
*G02B 5/20* (2006.01)
*G02B 3/00* (2006.01)

(52) U.S. Cl.
CPC .............. *G01J 1/44* (2013.01); *G02B 3/0068* (2013.01); *G02B 5/201* (2013.01); *H01L 27/1463* (2013.01); *H01L 27/1464* (2013.01); *H01L 27/14621* (2013.01); *H01L 27/14636* (2013.01); *H01L 27/14643* (2013.01); *H01L 27/14645* (2013.01); *H01L 27/14685* (2013.01); *G01J 2001/446* (2013.01); *G01J 2001/448* (2013.01); *H01L 27/14629* (2013.01)

(58) Field of Classification Search
CPC ......... H01L 27/14685; H01L 27/14629; H01L 27/1463; H01L 27/14643; H01L 27/14625; H01L 2224/73265; H01L 2924/12043; G01J 1/0411; G01J 1/0488; G01J 1/44; G01J 2001/446; G01J 2001/448; G01J 3/0208; G02B 3/0068; G02B 5/201; G02B 27/0955; H04N 5/2254

See application file for complete search history.

(56) References Cited

U.S. PATENT DOCUMENTS

| | | | |
|---|---|---|---|
| 2009/0256225 A1* | 10/2009 | Nakai ............... | H01L 27/14685 257/292 |
| 2013/0082165 A1* | 4/2013 | Ootsuka ............ | H01L 27/14612 257/E31.127 |
| 2015/0346547 A1* | 12/2015 | Wakabayashi .... | G02F 1/133526 349/95 |
| 2018/0173048 A1* | 6/2018 | Ito ....................... | G02F 1/13306 |
| 2020/0172443 A1* | 6/2020 | Kawamura ....... | H01L 27/14685 |
| 2022/0102407 A1* | 3/2022 | Irisa ......................... | H04N 9/07 |

OTHER PUBLICATIONS

Panasonic LX5 Review, https://www.imaging-resource.com/PRODS/LX5/LX5A.HTM, 22 pages.

\* cited by examiner

US 11,552,118 B2

IMAGE SENSOR INCLUDING A DOUBLE-SIDED SPHERICAL LENS

CROSS-REFERENCE TO RELATED APPLICATION

This application claims priority under 35 U.S.C. § 119 to Korean Patent Application No. 10-2019-0174287, filed on Dec. 24, 2019, in the Korean Intellectual Property Office, the disclosure of which is incorporated by reference herein in its entirety.

TECHNICAL FIELD

The inventive concept relates to an image sensor, and more particularly, to an image sensor including a double-sided spherical lens and a method of manufacturing the same.

DISCUSSION OF RELATED ART

Image sensors are semiconductor elements for converting optical images into electrical signals. For example, an image sensor detects and conveys information used to make an image. Such an image sensor may include a plurality of pixels arranged therein. Each of the pixels may include a photodiode (PD). The PD is a semiconductor device that converts incident light into an electrical signal. As semiconductor elements are highly integrated, the image sensors are also being highly integrated. To increase the integration of the image sensor, each of its pixels is made smaller; however, defects due to crosstalk are increasing. Crosstalk may be classified as optical crosstalk or electrical crosstalk. Optical crosstalk occurs when light incident through a microlens and a color filter is not transmitted to a corresponding pixel but rather to a pixel adjacent thereto. Electrical crosstalk occurs when electric charges generated by incident light having a long wavelength are transferred to an adjacent pixel.

SUMMARY

According to an exemplary embodiment of the inventive concept, there is provided an image sensor including: a substrate which has a first surface and a second surface opposite to the first surface and pixels arranged in a two-dimensional array, wherein each of the pixels includes a photodiode; a multi-wiring layer arranged on the first surface of the substrate; a color filter layer arranged on the second surface of the substrate and including color filters that respectively correspond to the pixels; and a lens layer arranged on the color filter layer and including a double-sided spherical lens, wherein the double-sided spherical lens includes at least two material layers having different refractive indexes.

According to an exemplary embodiment of the inventive concept, there is provided an image sensor including: a substrate which has a first surface and a second surface opposite to the first surface and pixels arranged in a two-dimensional array, wherein each of the pixels includes a photodiode; a multi-wiring layer arranged on the first surface of the substrate; a color filter layer arranged on the second surface of the substrate and including color filters that respectively correspond to the pixels; a planarization lens layer arranged on the color filter layer; and a double-sided spherical lens arranged on the planarization lens layer and protruding upward and downward, wherein the double-sided spherical lens includes a lower spherical lens and an upper spherical lens, and a refractive index of the planarization lens layer is less than a refractive index of the upper spherical lens, and the refractive index of the upper spherical lens is less than a refractive index of the lower spherical lens.

According to an exemplary embodiment of the inventive concept, there is provided a method of manufacturing an image sensor, the method including: forming, on a substrate, a plurality of pixels, wherein each of the pixels includes a photodiode; forming a wiring layer on a first surface of the substrate; forming, on a second surface of the substrate, a color filter layer including color filters that respectively correspond to the pixels; and forming, on the color filter layer, a lens layer including a double-sided spherical lens, wherein the double-sided spherical lens includes at least two material layers having different refractive indexes.

According to an exemplary embodiment of the inventive concept, there is provided an image sensor including: a substrate which has a first surface and a second surface opposite to the first surface and pixels arranged in a two-dimensional array, wherein each of the pixels includes a light emitting element; a wiring layer arranged on the first surface of the substrate; a color filter layer arranged on the second surface of the substrate and including color filters that respectively correspond to the pixels; and a double-sided spherical lens arranged on the color filter layer, wherein a refractive index of a first lens of the double-sided spherical lens is less than a refractive index of a second lens of the double-sided lens.

BRIEF DESCRIPTION OF THE DRAWINGS

The above and other features of the inventive concept will be more clearly understood by describing in detail exemplary embodiments thereof in conjunction with the accompanying drawings in which.

DETAILED DESCRIPTION OF THE EMBODIMENTS

Figure 1:
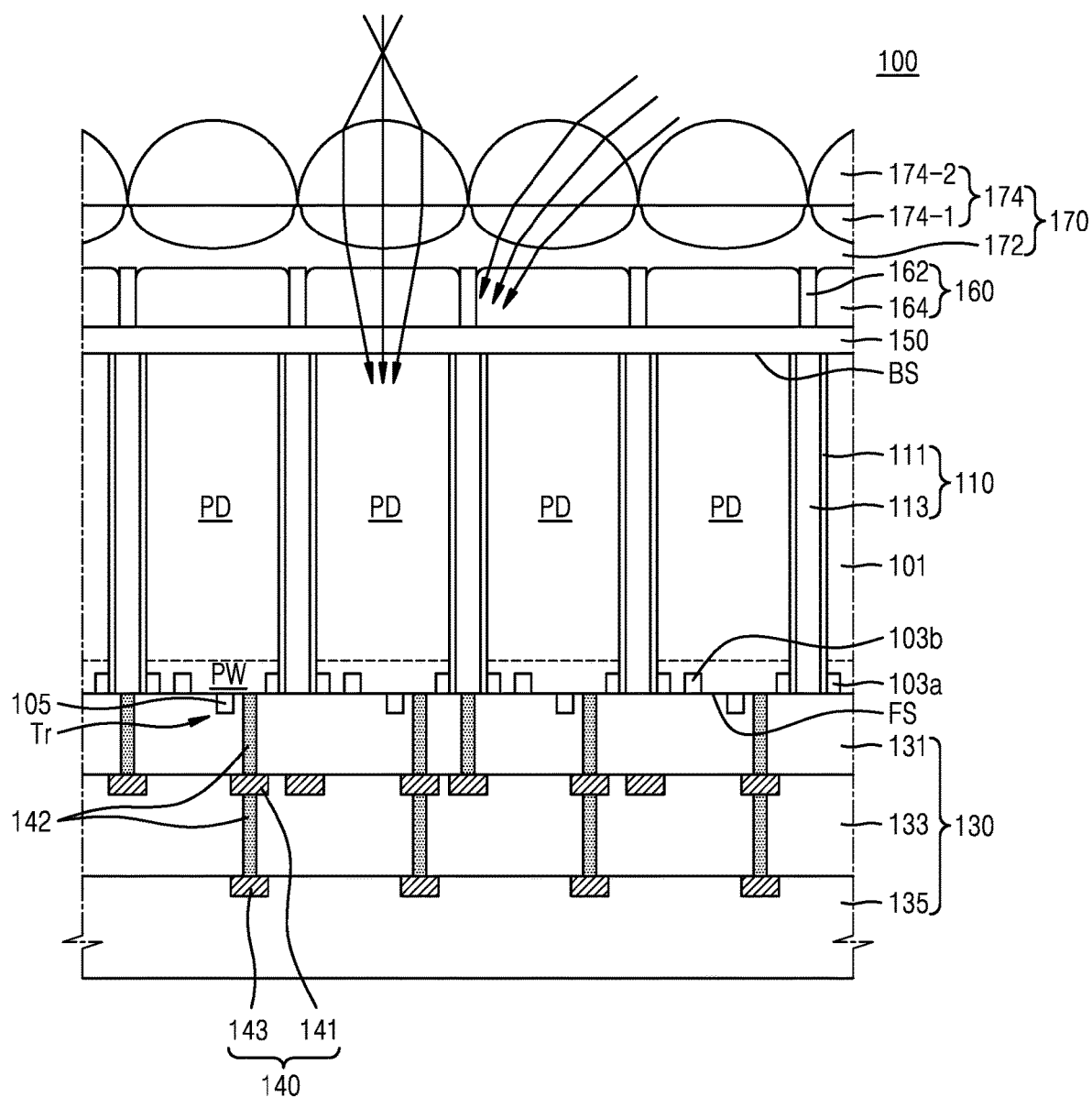
FIG. 1 is a cross-sectional view of an image sensor according to an exemplary embodiment of the inventive concept.

Hereinafter, exemplary embodiments of the inventive concept will be described in detail with reference to the accompanying drawings. The same reference numerals may be used for the same elements in the drawings, and thus, redundant descriptions thereof may be omitted.

Figure 2A:
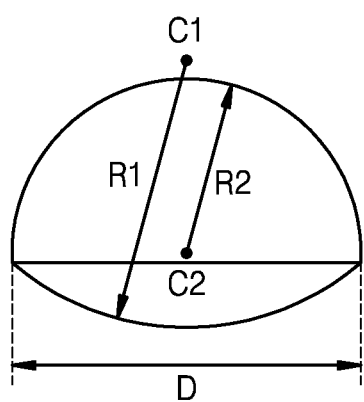
FIGS. 2A and 2B are respectively an enlarged cross-sectional view and an enlarged plan view of a double-sided spherical lens of the image sensor of FIG. 1.
Figure 2B:
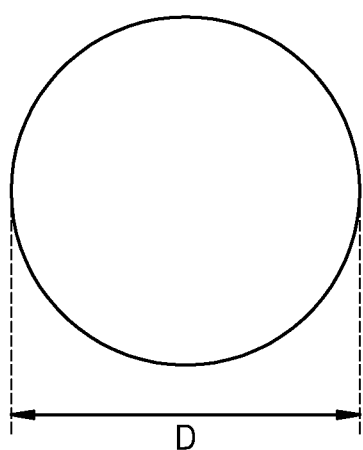

FIG. 1 is a cross-sectional view of an image sensor according to an exemplary embodiment of the inventive concept, and FIGS. 2A and 2B are respectively an enlarged cross-sectional view and an enlarged plan view of a double-sided spherical lens of the image sensor of FIG. 1.

Referring to FIGS. 1 to 2B, an image sensor 100 of the present embodiment may include a substrate 101, photodiodes PD, a pixel separation structure 110, a multi-wiring layer 140, a color filter layer 160, and a lens layer 170.

The substrate 101 may include a silicon bulk wafer and an epitaxial wafer. The epitaxial wafer may include a crystalline material layer, e.g., an epitaxial layer which is grown on a bulk substrate by an epitaxial process. The substrate 101 is not limited to either the silicon bulk wafer or the epitaxial wafer and may be formed using various wafers such as a polished wafer, an annealed wafer, and a silicon on insulator (SOI) wafer.

The substrate 101 may include a front side FS and a back side BS. As illustrated in FIG. 1, the multi-wiring layer 140 may be arranged on the front side FS of the substrate 101, and the color filter layer 160 and the lens layer 170 may be arranged on the back side BS of the substrate 101. Light may be incident through the back side BS on which the lens layer 170 is arranged. An image sensor having a structure in which the light is incident through the back side BS of the substrate 101, as just described, is referred to as a back side illumination (BSI) image sensor. On the other hand, an image sensor having a structure in which the light is incident through the front side FS of the substrate 101 is referred to as a front side illumination (FSI) image sensor.

In the substrate 101, a pixel region including a plurality of pixels or an active pixel sensor (APS) region may be arranged. The horizontal cross-section of the APS region may have a rectangular shape. However, the horizontal cross-section of the APS region is not limited to the rectangular shape. A peripheral circuit region may be arranged outside the APS region. According to an exemplary embodiment of the inventive concept, the image sensor may have a stacked multi-chip structure. In the image sensor having the stacked multi-chip structure, an APS region is provided in one chip, and a peripheral circuit region is provided in another chip. The APS and peripheral circuit regions may be connected to each other via a through-contact hole or the like.

Each of the pixels absorbs the incident light and may generate and accumulate electric charges that correspond to the quantity of light. Each of the pixels may include a photodiode PD and a well region PW, which are provided in the substrate 101. The photodiode PD and the well region PW may be formed on the APS region of the substrate 101 by an ion implantation process. For example, in a case in which the substrate 101 is based on a P-type epitaxial wafer, the photodiode PD may be doped with N-type impurities, and the well region PW may be doped with P-type impurities. According to an exemplary embodiment of the inventive concept, the doping of the well region PW with the P-type impurities may be omitted. The photodiode PD may be formed relatively deeply from the front side FS to the back side BS of the substrate 101. In addition, the well region PW may be formed relatively shallow in the front side FS of the substrate 101. In other words, the photodiode PD may extend from the back side BS of the substrate 101 to an area close to the front side FS of the substrate 101 and the well region PW may be disposed adjacent to the front side FS of the substrate 101.

Each of the pixels may include the photodiode PD and four transistors such as a transfer transistor, a source follower transistor, a reset transistor, and a selection transistor. However, the number of transistors for each of the pixels is not limited to four. For example, the pixels may have a sharing pixel structure according to an exemplary embodiment of the inventive concept, in which the pixels may share and use transistors other than a transfer transistor.

The operation of an image sensor will now be described. First, in a state in which light is blocked, a source voltage is applied to a drain of a reset transistor and a drain of a source follower transistor to discharge electric charges that remain in a floating diffusion region. Subsequently, the reset transistor is turned off. When light is to be incident on the photodiode PD from the outside, an electron-hole pair is generated in the photodiode PD. A hole moves toward a P-type impurity implantation region, and an electron moves toward an N-type impurity implantation region. Subsequently, when the transfer transistor is turned on, electric charges are moved to the floating diffusion region and accumulated therein. A gate bias voltage of the source follower transistor changes in proportion to an amount of the accumulated electric charges, and thus, a change in a source potential of the source follower transistor occurs. At this moment, the selection transistor is turned on, and thus, a sipal due to the electric charges may be read through a column line connected to a source region of the selection transistor.

The pixel separation structure 110 is arranged in the substrate 101 and may electrically separate the pixels. In a plan view, the pixel separation structure 110 may have a mesh or grid structure corresponding to a two-dimensional array structure of the pixels. In addition, the pixel separation structure 110 may have a depth corresponding to the thickness of the substrate 101. For example, as illustrated in FIG. 1, the pixel separation structure 110 may connect the front side FS and the back side BS of the substrate 101. The pixel separation structure 110 is referred to as a deep trench isolation (DTI) layer which is distinguished from a shallow trench isolation (STI) layer described later.

The pixel separation structure 110 may include a sidewall insulating layer 111 and a conductive layer 113 arranged within the sidewall insulating layer 111. The sidewall insulating layer 111 may include a material having a different refractive index from the substrate 101. For example, the sidewall insulating layer 111 may include a silicon oxide film, a silicon nitride film, or a silicon oxynitride film. In the image sensor 100 of the present embodiment, the sidewall insulating layer 111 may extend from the front side FS to the back side BS of the substrate 101.

The conductive layer 113 may include poly-Si, doped poly-Si, or the like. However, the material of the conductive layer 113 is not limited to the materials described above. The conductive layer 113 may include any conductive material capable of gap filling a trench inside the sidewall insulating layer 111. For example, the conductive layer 113 may include metal, a metal silicide, or a metal-containing conductive material. A ground voltage or a negative voltage is applied to the conductive layer 113 via a vertical contact 142 and first and second wiring layers 141 and 143, and thus, holes, which are likely to be present on the surface of the sidewall insulating layer 111, may be fixed to improve dark current characteristics.

In addition, the pixel separation structure 110 may have an integrally connected structure as a grid structure. In addition, the conductive layer 113 may have an integrally connected structure as a mesh structure. Thus, the conductive layer 113 may have an electrical single body structure. In other words, when electricity is applied to one portion of the conductive layer 113, the electricity may be applied to the entire conductive layer 113. However, according to an exemplary embodiment of the inventive concept, the conductive layer 113 may not be integrally connected and have an individually separated structure.

The pixel separation structure 110 may be formed from the front side FS to the back side BS of the substrate 101, and accordingly, the pixels are separated from each other. Thus, crosstalk due to slantingly incident light, for example, optical crosstalk, may be prevented. The photodiode PD may be apart from the pixel separation structure 110 or may be adjacent to the pixel separation structure 110. In other words, the photodiode PD may contact the pixel separation structure 110. When the photodiode PD is adjacent to the pixel separation structure 110, the surface area of the photodiode PD becomes substantially equal to the surface area of each pixel, and thus, a light receiving area is widened and a fill factor is improved. Therefore, quantum efficiency (QE) may be improved.

The well region PW is arranged in an upper portion of the photodiode PD on the front side FS of the substrate 101, and transistors Tr may be arranged on the well region PW. In FIG. 1, only gate electrodes 105 of the transistors Tr are illustrated. In the well region PW, STI layers 103a and 103b may be arranged to form an active region of the transistors Tr. For example, the active region of the transistors Tr may be a source/drain region, which is a high concentration doped region formed in the well region PW. The STI layers 103a and 103b may have a shallower depth than the pixel separation structure 110. In some regions, the STI layer 103a and the pixel separation structure 110 may be coupled to each other. For example, the pixel separation structure 110 has a structure passing through the STI layer 103a and may be coupled to the STI layer 103a. The gate electrodes 105 of the transistors Tr may be disposed on one side of the front side FS of the substrate 101 and the STI layers 103a and 103b may be disposed on another side of the front side FS of the substrate 101.

A back side insulating layer 150 may be arranged on the back side BS of the substrate 101. The back side insulating layer 150 may be, for example, an insulating layer for planarization. The back side insulating layer 150 may be arranged so that the color filter layer 160 and the lens layer 170 are maintained at a uniform height. According to an exemplary embodiment of the inventive concept, the back side insulating layer 150 may include an anti-reflection layer, which is on the top surface and/or bottom surface thereof to prevent light incident on the pixels from being reflected. For example, the anti-reflection layer may include a hafnium oxide (HfOx). However, the material of the anti-reflection layer is not limited thereto.

The color filter layer 160 may be arranged on the back side insulating layer 150. The color filter layer 160 may include metal grids 162 and color filters 164. The metal grids 162 may separate the color filters 164. The metal grids 162 may include, for example, a material such as W, Al, TiN, or an Al compound containing Ti or Ta. However, the material of the metal grids 162 is not limited to the materials described above.

The color filters 164 may be arranged in an array structure corresponding to the pixels. In an exemplary embodiment of the inventive concept, the color filters 164 may have a Bayer pattern structure including a red filter, a green filter, and a blue filter. In another exemplary embodiment of the inventive concept, the color filters 164 may include a yellow filter, a magenta filter, and a cyan filter. In addition, the color filters 164 may additionally include a white filter.

The lens layer 170 may be arranged on the color filter layer 160. The lens layer 170 may include a planarization lens layer 172 and a double-sided spherical lens 174.

The planarization lens layer 172 may have a structure capable of accommodating the double-sided spherical lens 174. For example, the planarization lens layer 172 may have recesses, each recessing downward to correspond to the bottom surface of the double-sided spherical lens 174, in other words, to correspond to a shape of a lower spherical lens 174-1 protruding downward. For example, the recesses are shaped so that the lower spherical lens 174-1 may be positioned therein. The planarization lens layer 172 having such a shape may be formed through an etchback process using a first reflow pattern (see reference numeral 180 of FIG. 5E). The forming of the planarization lens layer 172 will be described in more detail when describing a method of manufacturing an image sensor in FIGS. 5A to 5M.

The double-sided spherical lens 174 may include the lower spherical lens 174-1 constituting a lower layer and an upper spherical lens 174-2 constituting an upper layer. As illustrated in FIG. 1 and FIG. 2A, the lower spherical lens 174-1 may have a hemispherical shape protruding downward, and the upper spherical lens 174-2 may have a hemispherical shape protruding upward. FIG. 2B is a plan view of the double-sided spherical lens 174 when viewed from above, and a circular shape may appear corresponding to a joint section between the lower spherical lens 174-1 and the upper spherical lens 174-2.

The lower spherical lens 174-1 and the upper spherical lens 174-2 may include different materials, for example, materials having different refractive indexes. In addition, as illustrated in FIG. 1 or FIG. 2A, the lower spherical lens 174-1 and the upper spherical lens 174-2 may have different curvatures. For example, the curvature of the lower spherical lens 174-1 may be less than the curvature of the upper spherical lens 174-2. Accordingly, the radius R1 of curvature of the lower spherical lens 174-1 may be greater than the radius R2 of curvature of the upper spherical lens 174-2. Here, C1 and C2 may represent the centers of curvatures for the radii R1 and R2 of curvatures, respectively.

According to an exemplary embodiment of the inventive concept, the curvature of the lower spherical lens 174-1 and the curvature of the upper spherical lens 174-2 may be substantially equal to each other. In addition, the curvature of the lower spherical lens 174-1 may be greater than the curvature of the upper spherical lens 174-2. In addition to a refractive index described later, each of the curvatures of the lower spherical lens 174-1 and the upper spherical lens 174-2 constituting the double-sided spherical lens 174 may be appropriately set in the image sensor 100 of the present embodiment so that light being incident may be incident to the double-sided spherical lens's 174 corresponding pixel in the most efficient way.

When light is slantingly incident on a boundary surface between materials having different refractive indexes, refraction occurs on the boundary surface according a refraction law, in other words, Snell's law. For example, when light is slantingly incident from a material having a low refractive index (n1) to a material having a high refractive index (n2), and an incident angle (θi) and a refraction angle (θt) are defined relative to a normal to the boundary surface, n1*sin(θi)=n2*sin(θt) is satisfied by the refraction law, resulting in θi>θt. Thus, the light bends toward the normal while passing through the boundary surface.

The image sensor 100 of the present embodiment may have a structure in which the double-sided spherical lens 174 is arranged on the planarization lens layer 172 on the basis of the refraction law, in other words, Snell's law. In addition, the refractive index of each of the planarization lens layer 172 and the lower spherical lens 174-1 and the upper spherical lens 174-2 of the double-sided spherical lens 174 is appropriately controlled, and thus, light being incident may be more efficiently collected onto the double-sided spherical lens's 174 corresponding pixel.

For example, in the image sensor 100 of the present embodiment, the refractive index may increase in the order of the planarization lens layer 172, the upper spherical lens 174-2, and the lower spherical lens 174-1. When refractive indexes have the order described above, the light incident nearly perpendicular to a central portion of the double-sided spherical lens 174 is refracted on boundary portions of the lens layer 170 and incident on the central portion of the corresponding pixel, as illustrated with arrows on the left side of FIG. 1. Thus, light collection efficiency may be improved. In addition, as illustrated with arrows on the right side of FIG. 1, light slantingly incident on the double-sided spherical lens 174 is also refracted on the boundary portions and may be incident on the corresponding pixel without crossing into another adjacent pixel. When a lens layer includes the same material having one refractive index like an existing image sensor, light is refracted once on a boundary between air and the lens layer. Thus, the optical crosstalk may occur, in which slantingly incident light may not be incident on a corresponding pixel but incident on another pixel. However, in the image sensor 100 of the present embodiment, the double-sided spherical lens 174 is employed, and the lower spherical lens 174-1 and the upper spherical lens 174-2 of the double-sided spherical lens 174 as well as the planarization lens layer 172 are designed to have refractive indexes different from each other. Thus, the light may be efficiently collected into the corresponding pixel, and also, the occurrence of optical crosstalk may be reduced. Therefore, failures of the image sensor may be reduced.

For example, the planarization lens layer 172 may have a refractive index of about 1.2 to about 1.8 and include polyimide, $SiO_2$, or the like. In addition, the lower spherical lens 174-1 may have a refractive index of about 1.8 to about 2.5 and include polyimide, SiN, $SiO_2$, SiON, HfOx, $TiO_2$, or the like. In addition, the upper spherical lens 174-2 may have a refractive index of about 1.4 to about 1.8 and include polyimide, $SiO_2$, $Al_2O_3$, or the like. Here, the refractive index and material of each of the planarization lens layer 172, the lower spherical lens 174-1, and the upper spherical lens 174-2 are not limited to the values and materials described above.

For example, the polyimide may have various refractive indexes depending on components thereof and synthesis methods. For example, the polyimide may have a refractive index of about 1.5 to about 1.89. The refractive index of $SiO_2$ is about 1.457, the refractive index of SiN is about 2.023, and SiON may have a refractive index between the refractive indexes of $SiO_2$ and SiN. Here, a refractive index of HfOx is about 1.910, a refractive index of $TiO_2Al$ is about 2.874 (rutile) and 2.493 (amorphous), and a refractive index of $Al_2O_3$ is about 1.770. Here, the refractive index changes depending on a wavelength of light, and the refractive indexes described above are values based on a wavelength of about 632.8 nm.

Referring back to FIG. 1, an interlayer insulating layer 130 and the multi-wiring layer 140 may be arranged on the front side FS of the substrate 101. The interlayer insulating layer 130 may be formed as a multi-layer. For example, the interlayer insulating layer 130 may include first, second and third insulating layers 131, 133, and 135. Here, the number of layers of the interlayer insulating layer 130 is not limited to three. For example, the interlayer insulating layer 130 may include four or more layers.

The multi-wiring layer 140 may include a plurality of wiring layers. For example, the multi-wiring layer 140 may include the first wiring layer 141 on the first insulating layer 131 and the second wiring layer 143 on the second insulating layer 133. Here, the number of layers of the multi-wiring layer 140 is not limited to two. For example, the multi-wiring layer 140 may include three or more layers depending on the number of layers of the interlayer insulating layer 130. The first and second wiring layers 141 and 143 of the multi-wiring layer 140 are electrically connected to each other via the vertical contact 142, and may also be electrically connected to the active regions (e.g., the STI layers 103a and 103b) of the substrate 101 and the conductive layer 113 of the pixel separation structure 110. The multi-wiring layer 140 may be extended to a peripheral circuit region outside the APS region.

The image sensor 100 of the present embodiment may include the lens layer 170 that includes the double-sided spherical lens 174 and the planarization lens layer 172 on the color filter layer 160. In addition, the planarization lens layer 172 and the lower spherical lens 174-1 and the upper spherical lens 174-2 of the double-sided spherical lens 174 may include materials having different refractive indexes. Accordingly, the image sensor 100 of the present embodiment may significantly improve light collection efficiency and reduce optical crosstalk due to the lens layer 170 including materials having different refractive indexes.

Figure 3A:
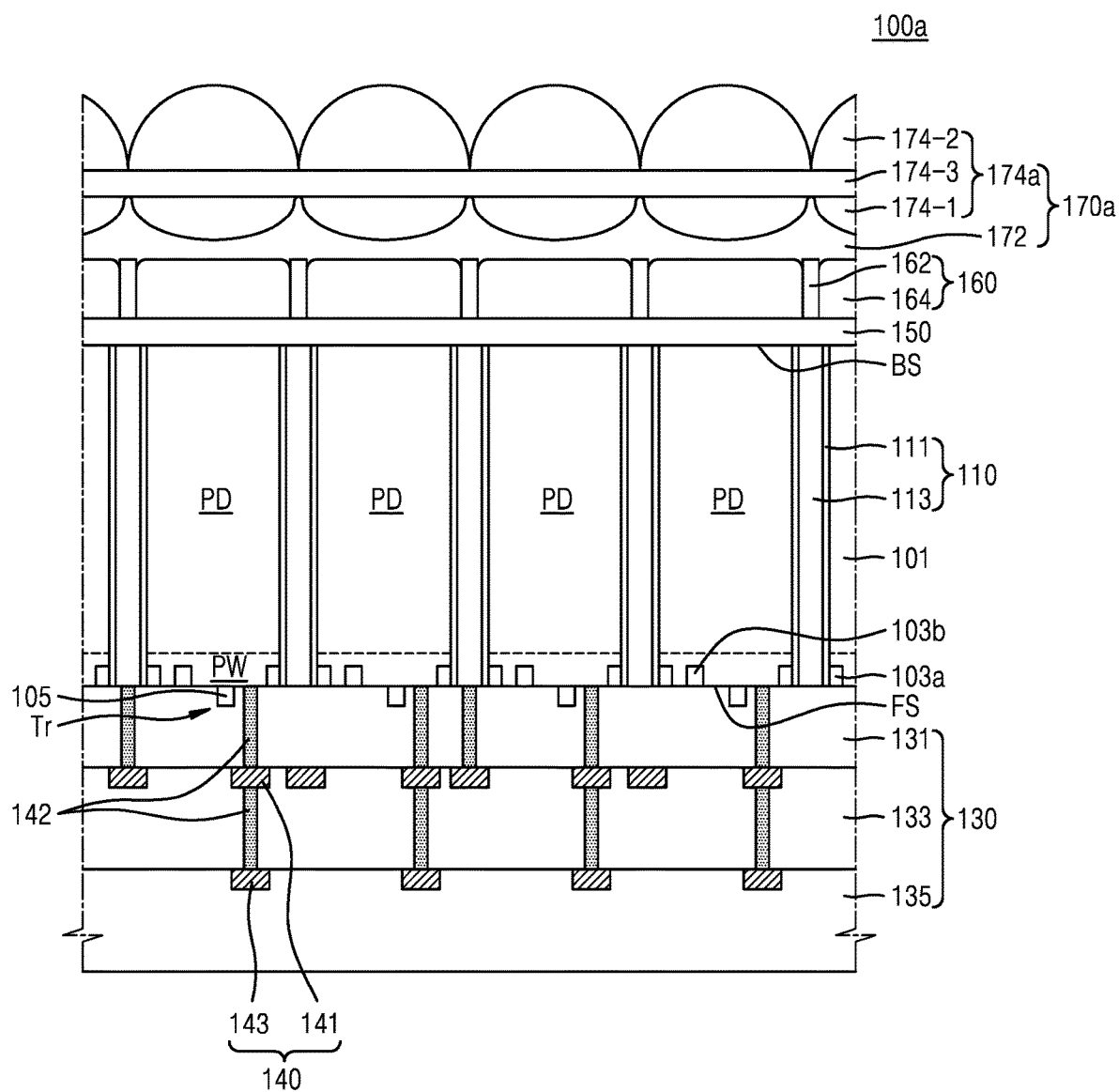
FIGS. 3A, 3B and 3C are cross-sectional views of image sensors according to exemplary embodiments of the inventive concept.
Figure 3B:
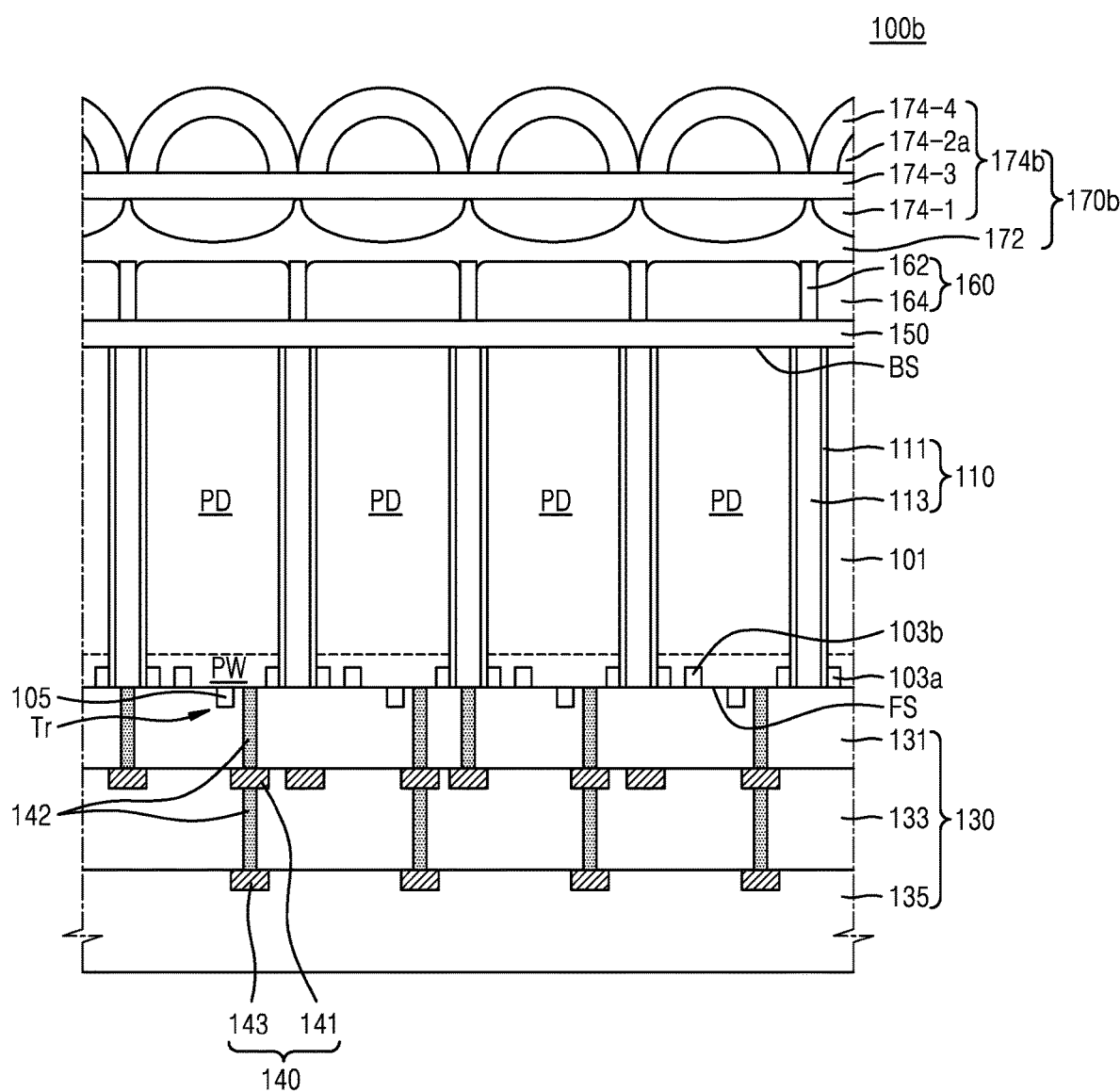
Figure 3C:
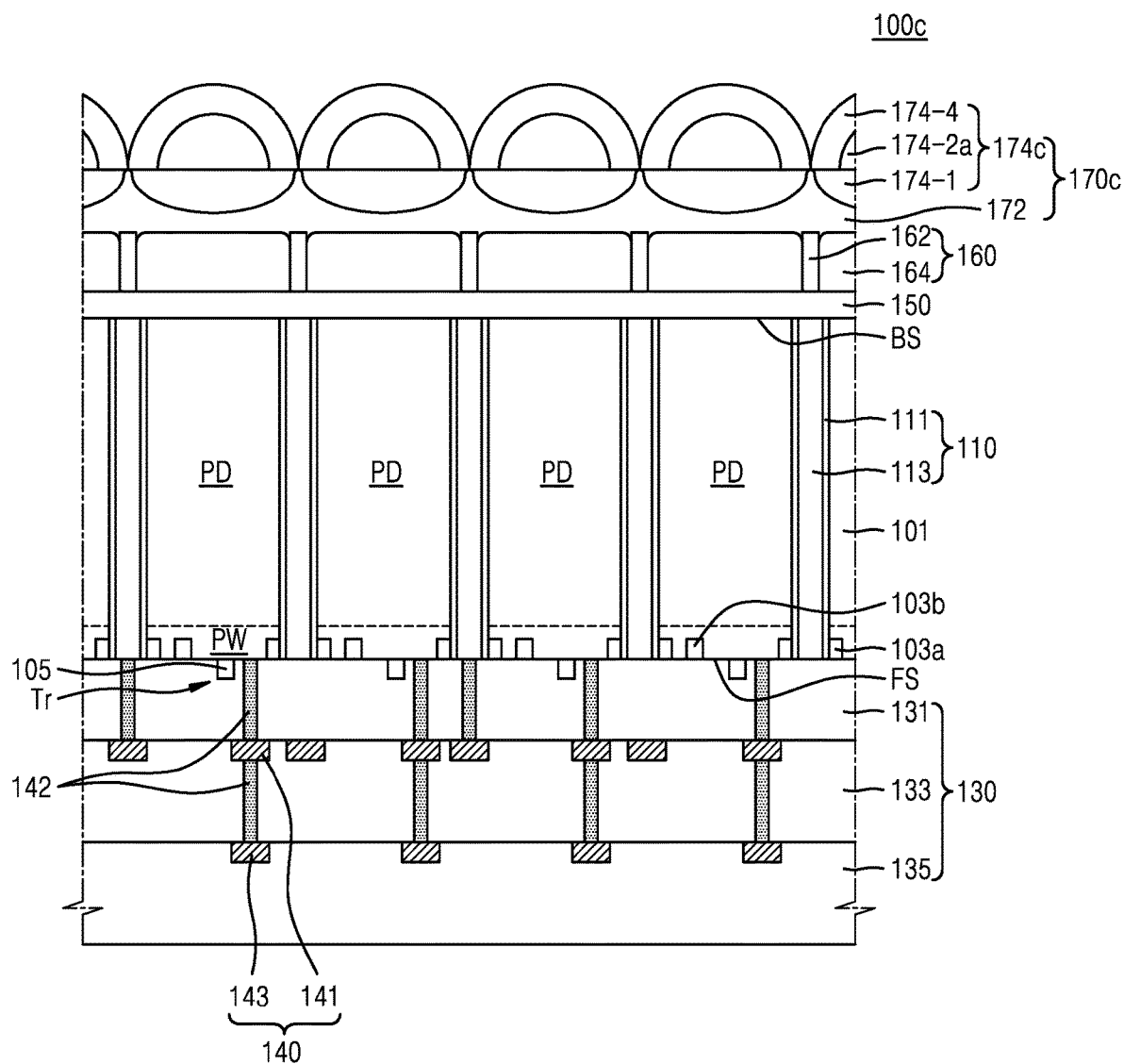

FIGS. 3A to 3C are cross-sectional views of image sensors according to exemplary embodiments of the inventive concept. The descriptions given above with reference to FIGS. 1 to 2B are briefly given or omitted.

Referring to FIG. 3A, an image sensor 100a of the present embodiment may be different from the image sensor 100 of FIG. 1 in terms of the structure of a lens layer 170a. For example, in the image sensor 100a of the present embodiment, the lens layer 170a includes a planarization lens layer 172 and a double-sided spherical lens 174a that may further include an intermediate lens 174-3. In other words, the double-sided spherical lens 174a may include a lower spherical lens 174-1 constituting a lower layer, an upper spherical lens 174-2 constituting an upper layer, and the intermediate lens 174-3 constituting an intermediate layer between the lower spherical lens 174-1 and the upper spherical lens 174-2.

The intermediate lens 174-3 may have a refractive index between a refractive index of the lower spherical lens 174-1 and a refractive index of the upper spherical lens 174-2. In other words, in the double-sided spherical lens 174a of the image sensor 100a of the present embodiment, the refractive index may increase in the order of the upper spherical lens 174-2, the intermediate lens 174-3, and the lower spherical lens 174-1. For example, the refractive index of the intermediate lens 174-3 may be greater than that of the upper spherical lens 174-2 and lower than that of the lower spherical lens 174-1. As described above, the refractive index of the planarization lens layer 172 may be less than the refractive index of the upper spherical lens 174-2.

In addition, the intermediate lens 174-3 may include one of materials included in the lower spherical lens 174-1 and the upper spherical lens 174-2. The intermediate lens 174-3 may have a flat plate shape with a uniform thickness as illustrated in FIG. 3A. In other words, the intermediate lens 174-3 may be integrally formed having a single flat plate shape, and the entire flat plate may serve as the intermediate lens 174-3 to constitute the double-sided spherical lens 174a.

Referring to FIG. 3A, the intermediate lens 174-3 may be relatively thinner than the lower spherical lens 174-1 or the upper spherical lens 174-2. For example, when the lower spherical lens 174-1 or the upper spherical lens 174-2 has a thickness of about 500 nm, the intermediate lens 174-3 may have a thickness of 100 nm or less, or tens of nanometers. The intermediate lens 174-3 may contribute to improving light collection efficiency by preventing reflection rather than improving light collection efficiency due to refraction. For example, the intermediate lens 174-3 may be an anti-reflection layer, and may include SiON, HfOx, or the like. However, the function and material of the intermediate lens 174-3 is not limited thereto.

Referring to FIG. 3B, an image sensor 100b of the present embodiment may be different from the image sensor 100 of FIG. 1 in terms of the structure of a lens layer 170b. For example, in the image sensor 100b of the present embodiment, the lens layer 170b includes a planarization lens layer 172 and a double-sided spherical lens 174b, and the double-sided spherical lens 174b may further include an intermediate lens 174-3 and a cover lens 174-4.

In addition, in the image sensor 100b of the present embodiment, the size of an upper spherical lens 174-2a may be less than the size of a lower spherical lens 174-1, and the total size of the upper spherical lens 174-2a and the cover lens 174-4 may correspond to the size of the lower spherical lens 174-1. For example, the size of the bottom surface of the upper spherical lens 174-2a is less than the size of the top surface of the lower spherical lens 174-1. In addition, the outer diameter of the bottom surface of the cover lens 174-4 may be substantially equal to the diameter of the top surface of the lower spherical lens 174-1. Here, the bottom surface of the cover lens 174-4 has a donut shape and may have the outer diameter and an inner diameter. Compared to the image sensor 100 of FIG. 1, the structure in which the upper spherical lens 174-2a and the cover lens 174-4 are combined may correspond to the upper spherical lens 174-2 of the image sensor 100 of FIG. 1.

The cover lens 174-4 may have a uniform thickness to cover the upper spherical lens 174-2a. Accordingly, the cover lens 174-4 may have a hollow hemispherical shape. The cover lens 174-4 may be relatively thin and include a material having a low refractive index. For example, the cover lens 174-4 may have a thickness of about 100 nm and a very low refractive index of about 1.0 to about 1.4. The cover lens 174-4 may include, for example, polyimide, SiO₂, or the like. Here, the thickness, refractive index, and material of the cover lens 174-4 are not limited to those described above.

Generally, as the difference in refractive indexes increases, larger reflection may occur. Thus, the cover lens 174-4 having the smallest difference in refractive index with respect to air is arranged in the outermost side of the double-sided spherical lens 174b, and thus, the reflection may be reduced. In other words, the cover lens 174-4 may serve as an anti-reflection layer. Therefore, in the image sensor 100b of the present embodiment, the double-sided spherical lens 174b may increase the light collection efficiency of incident light while reducing the reflection of light and may also reduce optical crosstalk.

Referring to FIG. 3C, an image sensor 100c of the present embodiment may be different from the image sensor 100 of FIG. 1 in terms of the structure of a lens layer 170c. For example, in the image sensor 100c of the present embodiment, the lens layer 170c includes a planarization lens layer 172 and a double-sided spherical lens 174c that may further include a cover lens 174-4. In addition, the double-sided spherical lens 174c of the image sensor 100c of the present embodiment may have a structure in which an intermediate lens is omitted as compared to the double-sided spherical lens 174b of the image sensor 100b of FIG. 3B. In other words, an intermediate lens may not be disposed between the lenses forming the lens layer 170c.

An upper spherical lens 174-2a and the cover lens 174-4 are the same as those described in the double-sided spherical lens 174b of the image sensor 100b of FIG. 3B. Here, the cover lens 174-4 may serve as an anti-reflection layer as illustrated in the image sensor 100b of FIG. 3B. Thus, when one of the intermediate lens 174-3 (see FIGS. 3A and 3B) and the cover lens 174-4 has a function of efficiently preventing reflection, the other may be omitted. Therefore, the structure of the double-sided spherical lens 174c may be simplified to facilitate a manufacturing process of the double-sided spherical lens 174c. Consequently, costs and time required to manufacture the image sensor may be reduced.

FIGS. 4A to 4D are cross-sectional views of image sensors according to exemplary embodiments of the inventive concept. The descriptions given above with reference to FIGS. 1 to 3C are briefly given or omitted.

Figure 4A:
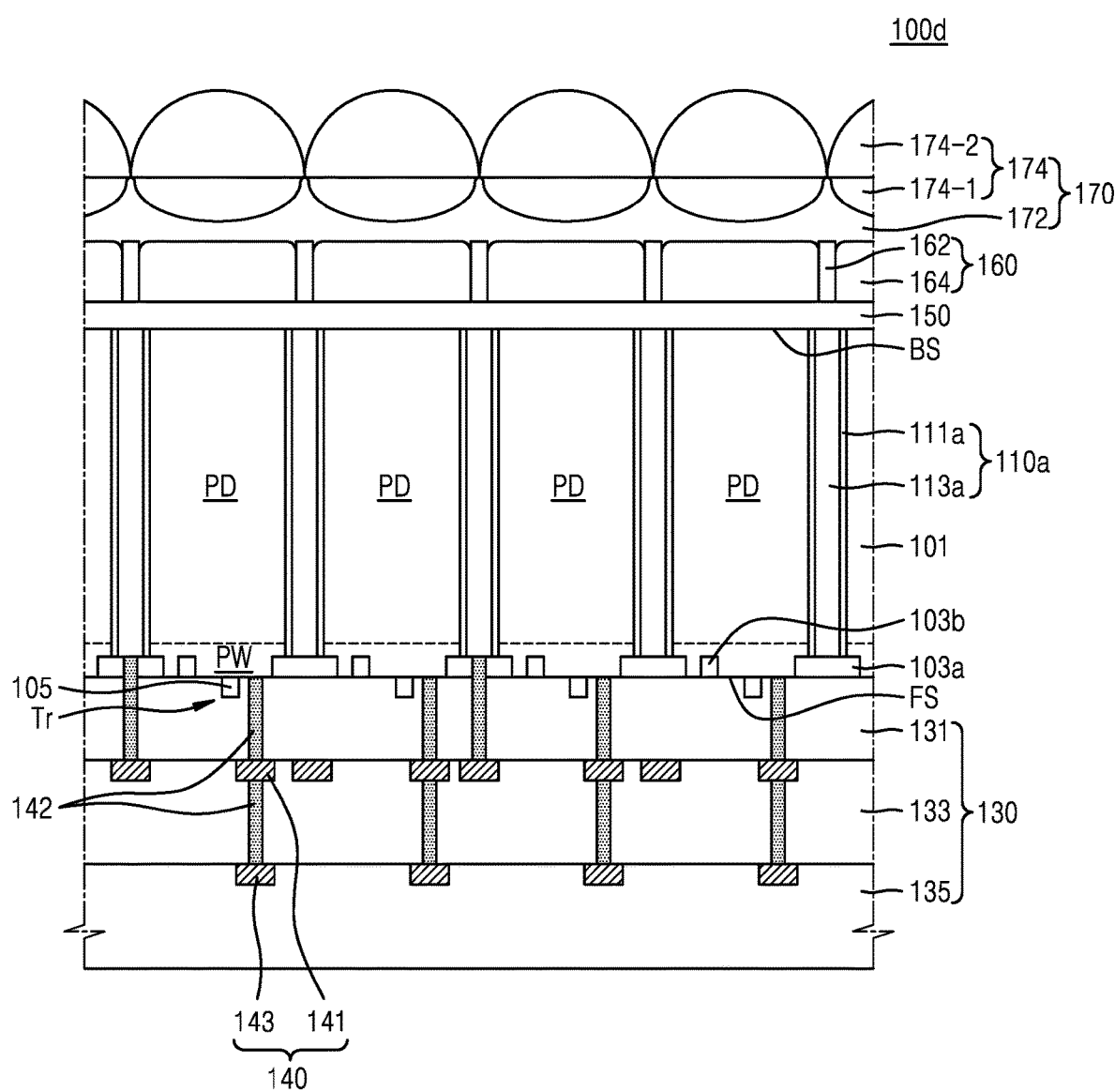
FIGS. 4A, 4B, 4C and 4D are cross-sectional views of image sensors according to exemplary embodiments of the inventive concept.

Referring to FIG. 4A, an image sensor 100d of the present embodiment may be different from the image sensor 100 of FIG. 1 in terms of the structure of a pixel separation structure 110a. For example, in the image sensor 100d of the present embodiment, the pixel separation structure 110a may have a structure that does not pass through an STI layer 103a and is in contact with a top surface of the STI layer 103a. In addition, since the pixel separation structure 110a is in contact with the top surface of the STI layer 103a, a vertical contact 142 may have a structure that passes through a first insulating layer 131 and the STI layer 103a and may be connected to a conductive layer 113a of the pixel separation structure 110a.

A lens layer 170 of the image sensor 100d of the present embodiment may have substantially the same structure as the lens layer 170 of the image sensor 100 of FIG. 1. Accordingly, the lens layer 170 may include a planarization lens layer 172 and a double-sided spherical lens 174, and the double-sided spherical lens 174 may include a lower spherical lens 174-1 and an upper spherical lens 174-2. However, the structure of the lens layer 170 of the image sensor 100d of the present embodiment is not limited to the structure of the lens layer 170 of the image sensor 100 of FIG. 1. For example, the structure of the lens layer 170 of the image sensor 100d of the present embodiment may employ one of the structures of the lens layers 170a to 170c of the image sensors 100a to 100c of FIGS. 3A to 3C.

For example, the image sensor 100 of FIG. 1 may be realized by first forming the STI layer 103a on the substrate 101 and then forming the pixel separation structure 110 in a portion of the STI layer 103a. On the other hand, the image sensor 100d of FIG. 4A may be realized by first forming the pixel separation structure 110a in a substrate 101 and then forming the STI layer 103a in a portion of the pixel separation structure 110a. Here, both the image sensor 100 of FIG. 1 and the image sensor 100d of FIG. 4A may be realized by forming a deep trench from the front side FS of the substrate 101 and then filling the deep trench with sidewall insulating layers 111 and 111a and the conductive layers 113 and 113a to form the pixel separation structures 110 and 110a.

Figure 4B:
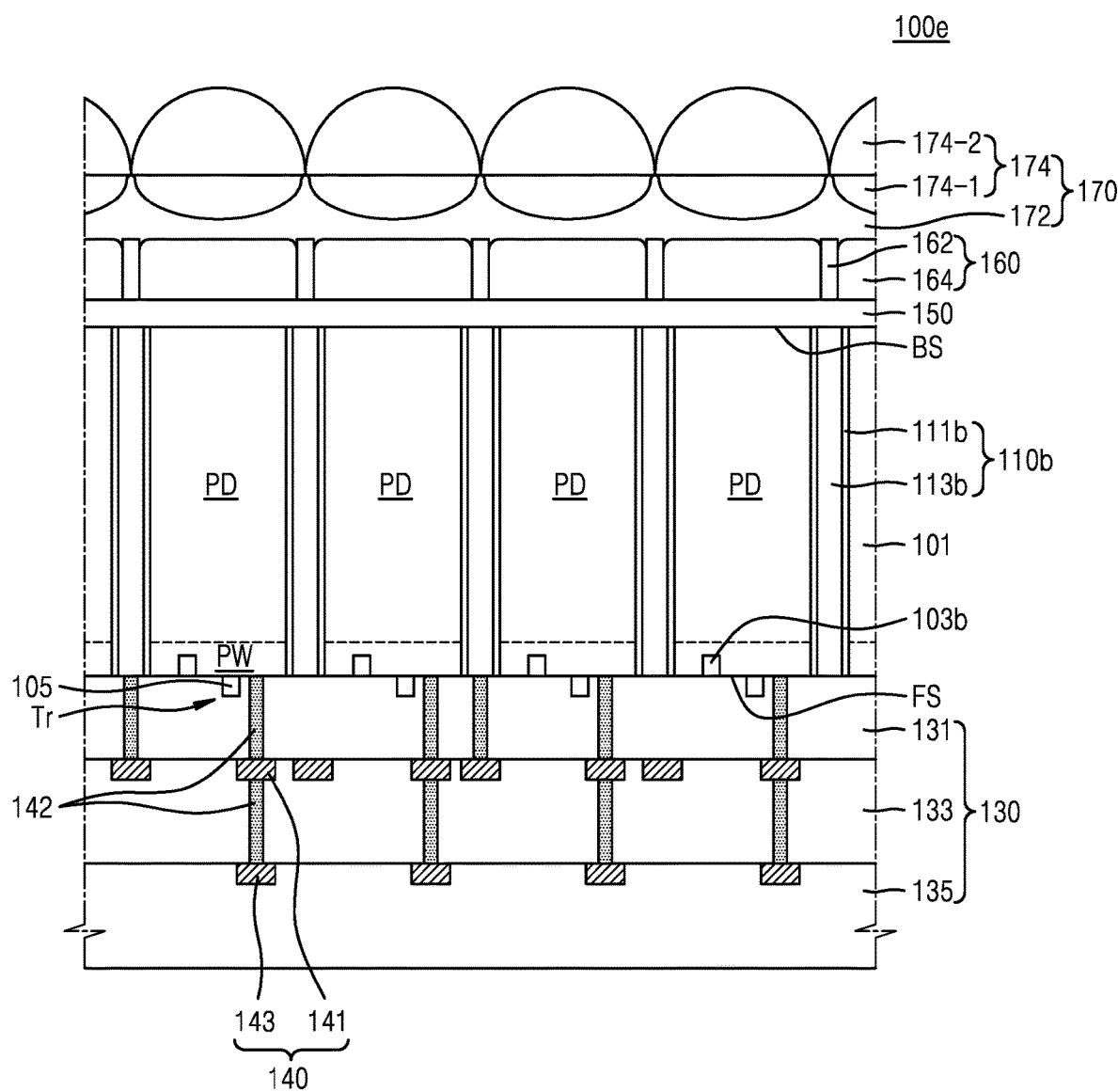

Referring to FIG. 4B, an image sensor 100e of the present embodiment may be different from the image sensor 100 of FIG. 1 in terms of the structure of a pixel separation structure 110b. For example, in the image sensor 100e of the present embodiment, the pixel separation structure 110b may have a structure that is not coupled to an STI layer 103a. In other words, the pixel separation structure 110b may be formed in a portion in which the STI layer 103a is not present. The pixel separation structure 110b may also be formed by forming a deep trench from a front side FS of a substrate 101 and then filling the deep trench with a sidewall insulating layer 111b and a conductive layer 113b.

A lens layer 170 of the image sensor 100e of the present embodiment may also have substantially the same structure as the lens layer 170 of the image sensor 100 of FIG. 1. However, the structure of the lens layer 170 of the image sensor 100e of the present embodiment is not limited to the structure of the lens layer 170 of the image sensor 100 of FIG. 1. For example, the structure of the lens layer 170 of the image sensor 100e of the present embodiment may employ one of the structures of the lens layers 170a to 170c of the image sensors 100a to 100c of FIGS. 3A to 3C.

Figure 4C:
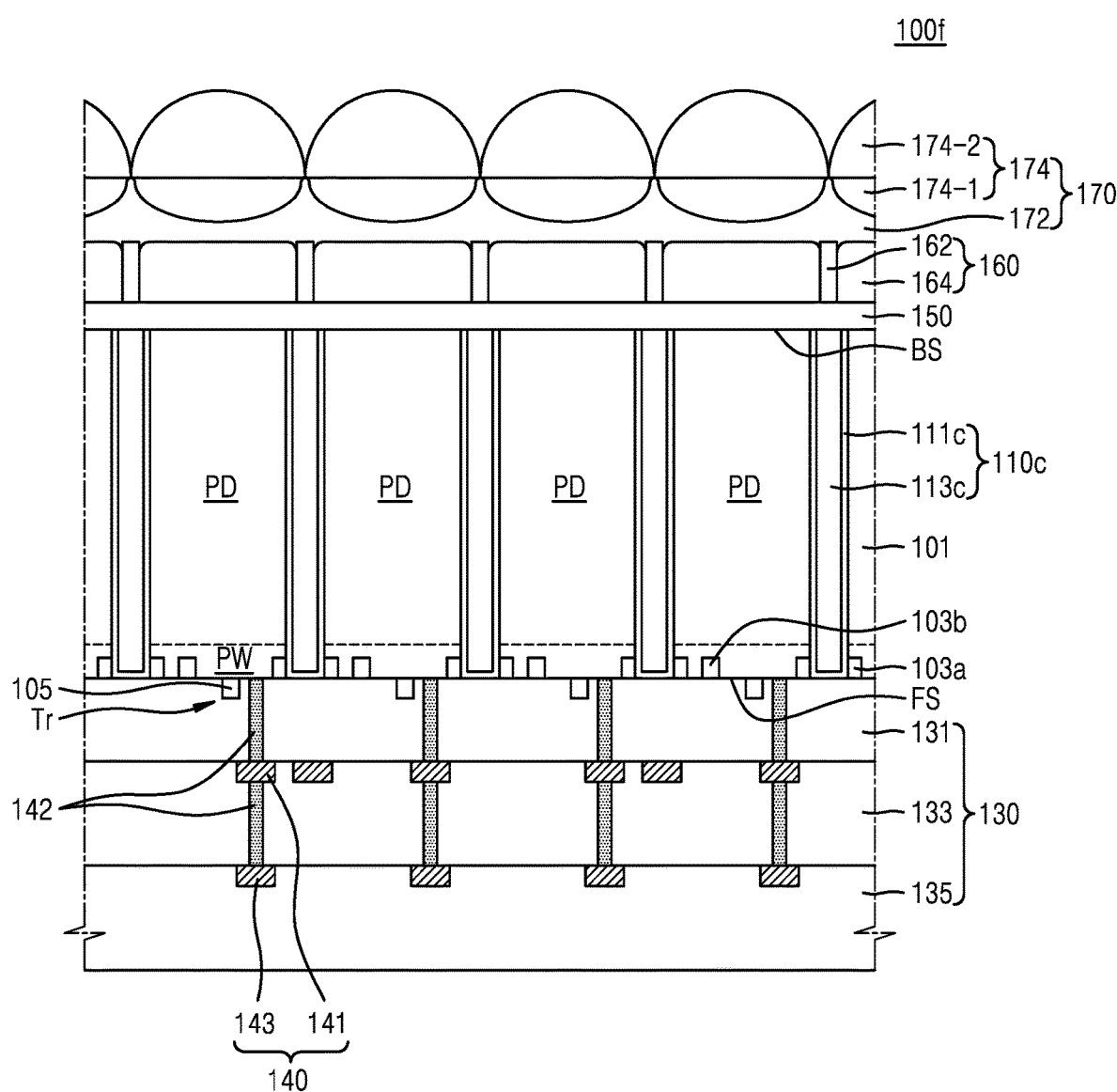

Referring to FIG. 4C, an image sensor 100f of the present embodiment may be different from the image sensor 100 of FIG. 1 in terms of the structure of a pixel separation structure 110c. For example, in the image sensor 100f of the present embodiment, the pixel separation structure 110c may have a structure coupled to an STI layer 103a, and a sidewall insulating layer 111c may surround a side surface and a bottom surface of a conductive layer 113c. In other words, the sidewall insulating layer 111c may extend from the side surface of the conductive layer 113c and cover the bottom surface of the conductive layer 113c. For example, the sidewall insulating layer 111c may be disposed between the conductive layer 113c and the STI layer 103a. Accordingly, in the pixel separation structure 110c, the sidewall insulating layer 111c may be exposed to a front side FS of the substrate 101 instead of the conductive layer 113c. In other words, the sidewall insulating layer 111c may form a portion of the front side FS of the substrate 101.

In addition, since the sidewall insulating layer 111c of the pixel separation structure 110c is exposed to the front side FS of the substrate 101 in the image sensor 100f of the present embodiment, a vertical contact, which passes through the sidewall insulating layer 111c and is connected to the conductive layer 113c of the pixel separation structure 110c, and a wiring layer, which is connected to the vertical contact, may be formed inside an interlayer insulating layer 130. In addition, according to an exemplary embodiment of the inventive concept, the vertical contact connected to the conductive layer 113c and the wiring layer connected to the vertical contact may be formed on the back side of the substrate 101.

A lens layer 170 of the image sensor 100f of the present embodiment may also have substantially the same structure as the lens layer 170 of the image sensor 100 of FIG. 1. However, the structure of the lens layer 170 of the image sensor 100f of the present embodiment is not limited to the structure of the lens layer 170 of the image sensor 100 of FIG. 1. For example, the structure of the lens layer 170 of the image sensor 100f of the present embodiment may employ one of the structures of the lens layers 170a to 170c of the image sensors 100a to 100c of FIGS. 3A to 3C.

Here, the image sensor 100f of the present embodiment may be realized by forming a deep trench extending from the back side BS to the front side FS of the substrate 101 and then filling the deep trench with the sidewall insulating layer 111c and the conductive layer 113c to form the pixel separation structure 110c. For example, the STI layers 103a and 103b are formed first in the front side FS of the substrate 101, and then the multi-wiring layer 140 is formed on the front side FS of the substrate 101. Subsequently, the deep trench is formed from the back side BS of the substrate 101, and the deep trench is filled with the sidewall insulating layer 111c and the conductive layer 113c, thereby forming the pixel separation structure 110c. In addition, the wiring layer and the vertical contact connected to the conductive layer 113c may be formed inside the interlayer insulating layer 130 or may be formed on the back side BS of the substrate 101. Finally, a back side insulating layer 150, a color filter layer 160, and a lens layer 170 may be formed on the back side BS of the substrate 101 to realize the image sensor 100f of the present embodiment.

Figure 4D:
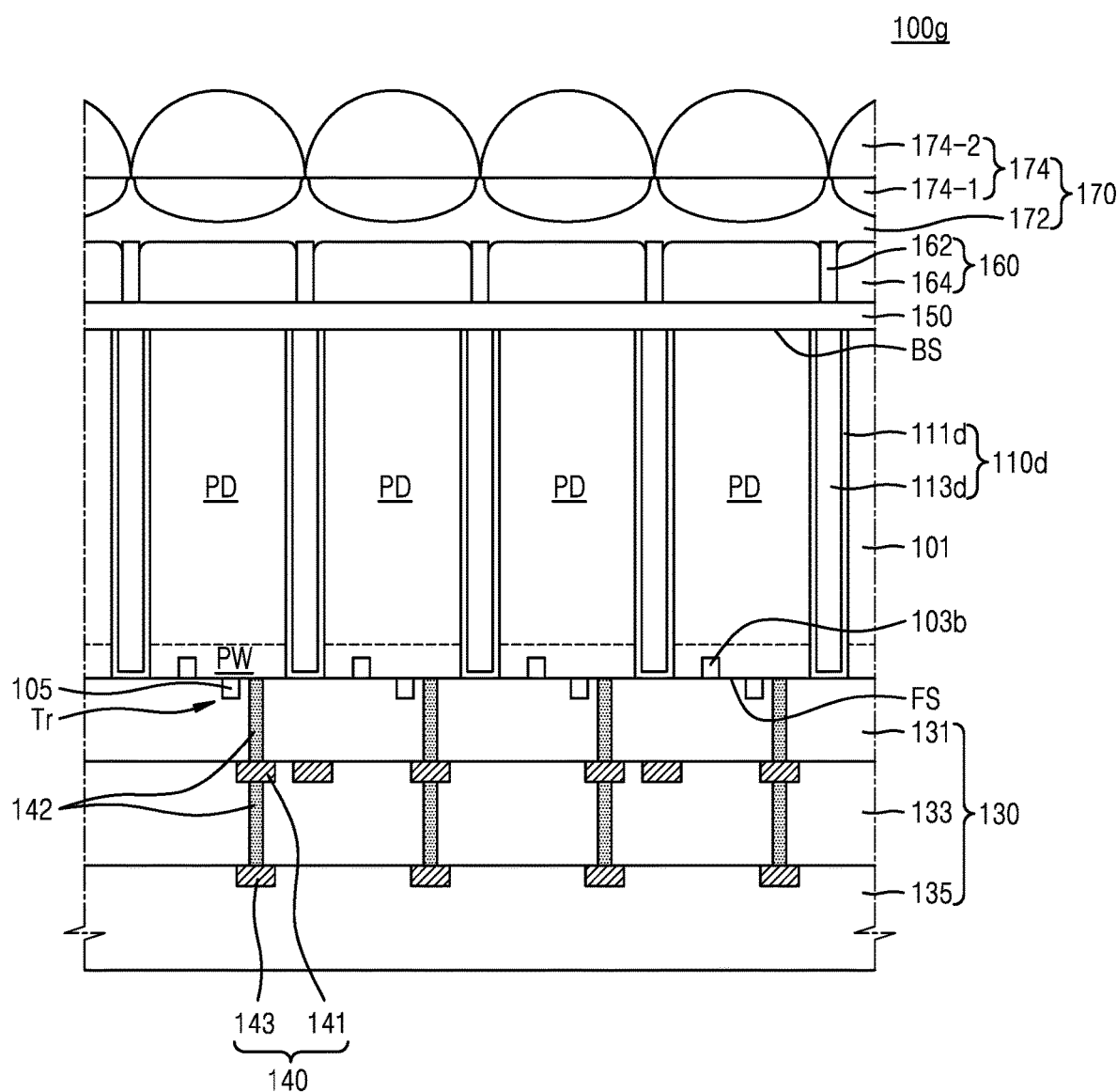

Referring to FIG. 4D, an image sensor 100g of the present embodiment may be different from the image sensor 100f of FIG. 4C in terms of the structure of a pixel separation structure 110d. For example, in the image sensor 100g of the present embodiment, the pixel separation structure 110d may have a structure that is not coupled to an STI layer 103a. In other words, the pixel separation structure 110d may be formed in a portion in which the STI layer 103a is not present. The pixel separation structure 110d may be formed by forming a deep trench extending from a back side BS to a front side FS of a substrate 101 and then filling the deep trench with a sidewall insulating layer 111d and a conductive layer 113d.

A lens layer 170 of the image sensor 100g of the present embodiment may also have substantially the same structure as the lens layer 170 of the image sensor 100 of FIG. 1. However, the structure of the lens layer 170 of the image sensor 100g of the present embodiment is not limited to the structure of the lens layer 170 of the image sensor 100 of FIG. 1. For example, the structure of the lens layer 170 of the image sensor 100g of the present embodiment may employ one of the structures of the lens layers 170a to 170c of the image sensors 100a to 100c of FIGS. 3A to 3C.

Although image sensors having various structures have been described, the inventive concept is not limited to the structures of the exemplified image sensors. For example, an image sensor according to an exemplary embodiment of the inventive concept may have a structure in which a lens layer includes a double-sided spherical lens, and the double-sided spherical lens includes at least two material layers having different refractive indexes to improve light collection efficiency and prevent optical crosstalk.

FIGS. 5A to 5M are cross-sectional views schematically showing processes in a method of manufacturing the image sensor of FIG. 1, according to an exemplary embodiment of the inventive concept. The descriptions of FIGS. 5A to 5M are made with reference to FIG. 1 together, and thus, the descriptions given above for certain elements in FIG. 1 are briefly given or omitted.

Figure 5A:
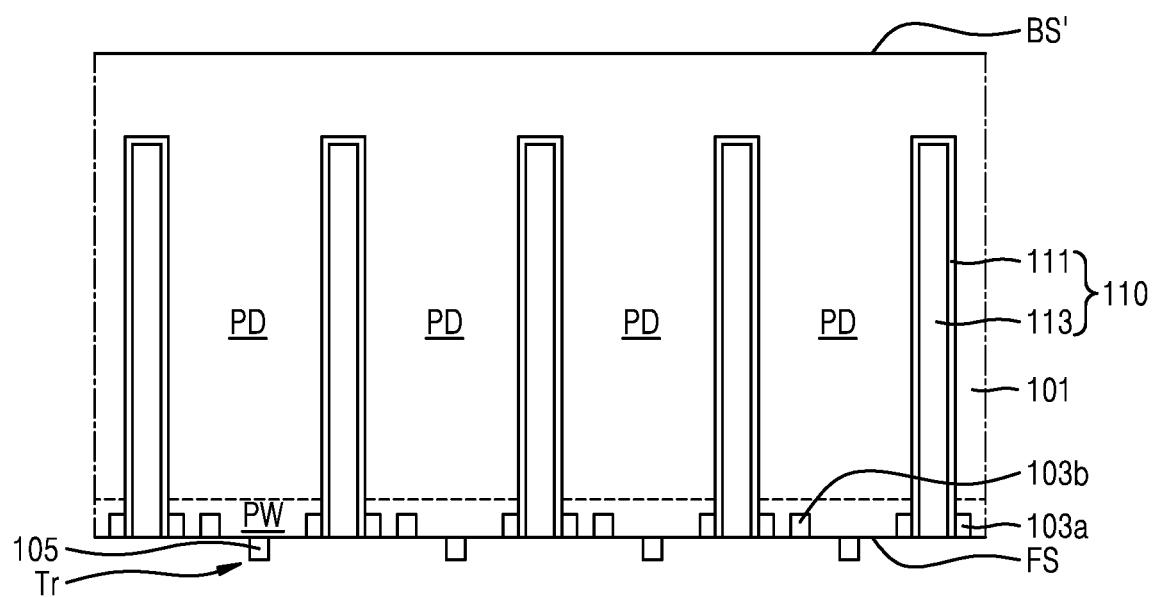
FIGS. 5A, 5B, 5C, 5D, 5E, 5F, 5G, 5H, 5I, 5J, 5K, 5L and 5M are cross-sectional views schematically showing processes in a method of manufacturing the image sensor of FIG. 1, according to an exemplary embodiment of the inventive concept.

Referring to FIG. 5A, an STI layer 103a is formed on a substrate 101, and then each of a plurality of pixel separation structures 110 passing through a portion of the STI layer 130a may be formed. Here, prior to forming STI layers 103a and 130b, the substrate 101 may be doped with impurities to form a photodiode PD and a well region PW. In addition, during the formation of the STI layers 103a and 103b, an active region may be defined on a front side of the substrate 101, and gate electrodes 105 may be formed to form transistors Tr within pixels. The pixel separation structure may be formed by forming a trench having a certain depth from a front side FS of the substrate 101 and then filling the inside of the trench with a sidewall insulating layer 111 and a conductive layer 113. A portion of the substrate 101 adjacent to a back side BS' of the substrate 101 may remain on one side of the trench.

Figure 5B:
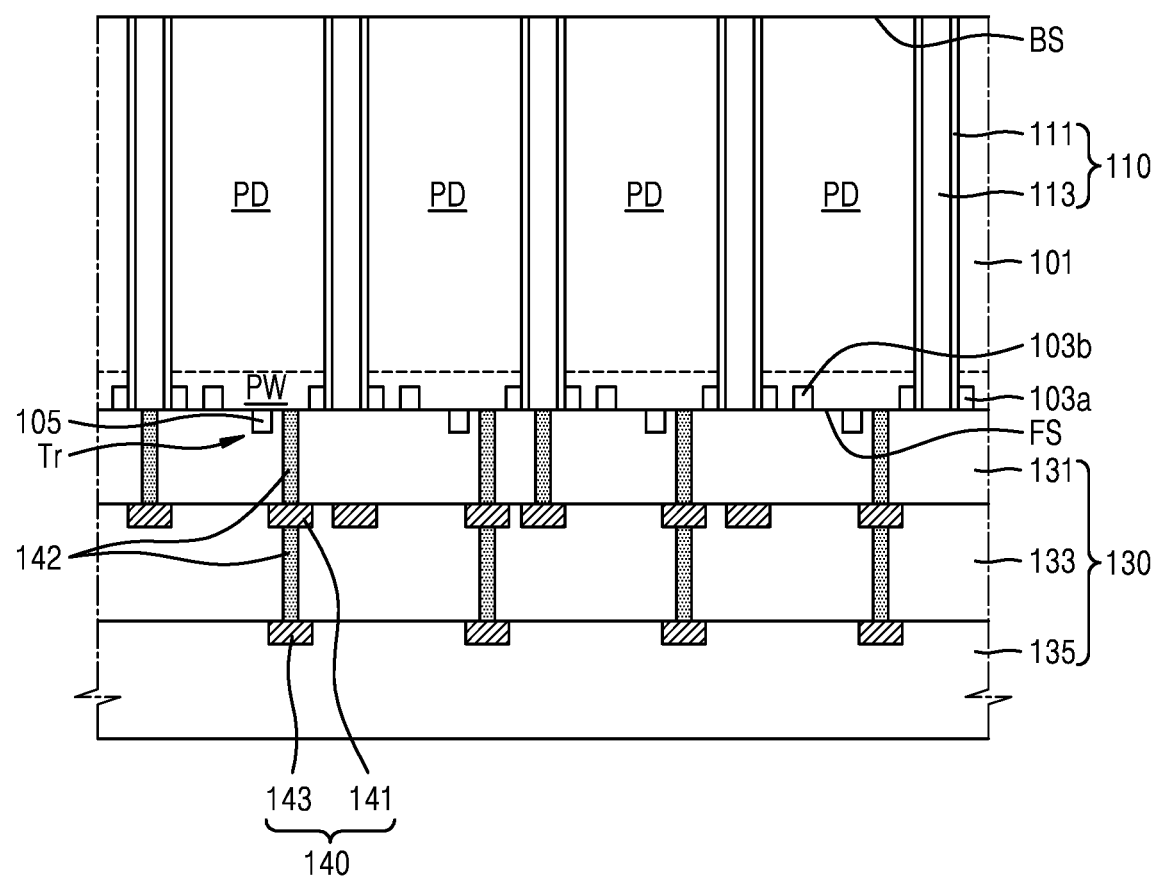

Referring to FIG. 5B, after the formation of the pixel separation structure 110, an interlayer insulating layer 130 and a multi-wiring layer 140 are formed on the front side FS of the substrate 101. The multi-wiring layer 140 may include a vertical contact 142 connected to the conductive layer 113 of the pixel separation structure 110 and a first wiring layer 141 connected to the vertical contact 142. Subsequently, a back side BS' of the substrate 101 is polished to make the substrate 101 thinner. Through the polishing of the back side BS' of the substrate 101, the conductive layer 113 of the pixel separation structure 110 is exposed, and a back side BS of the substrate 101 may be newly defined.

Figure 5C:
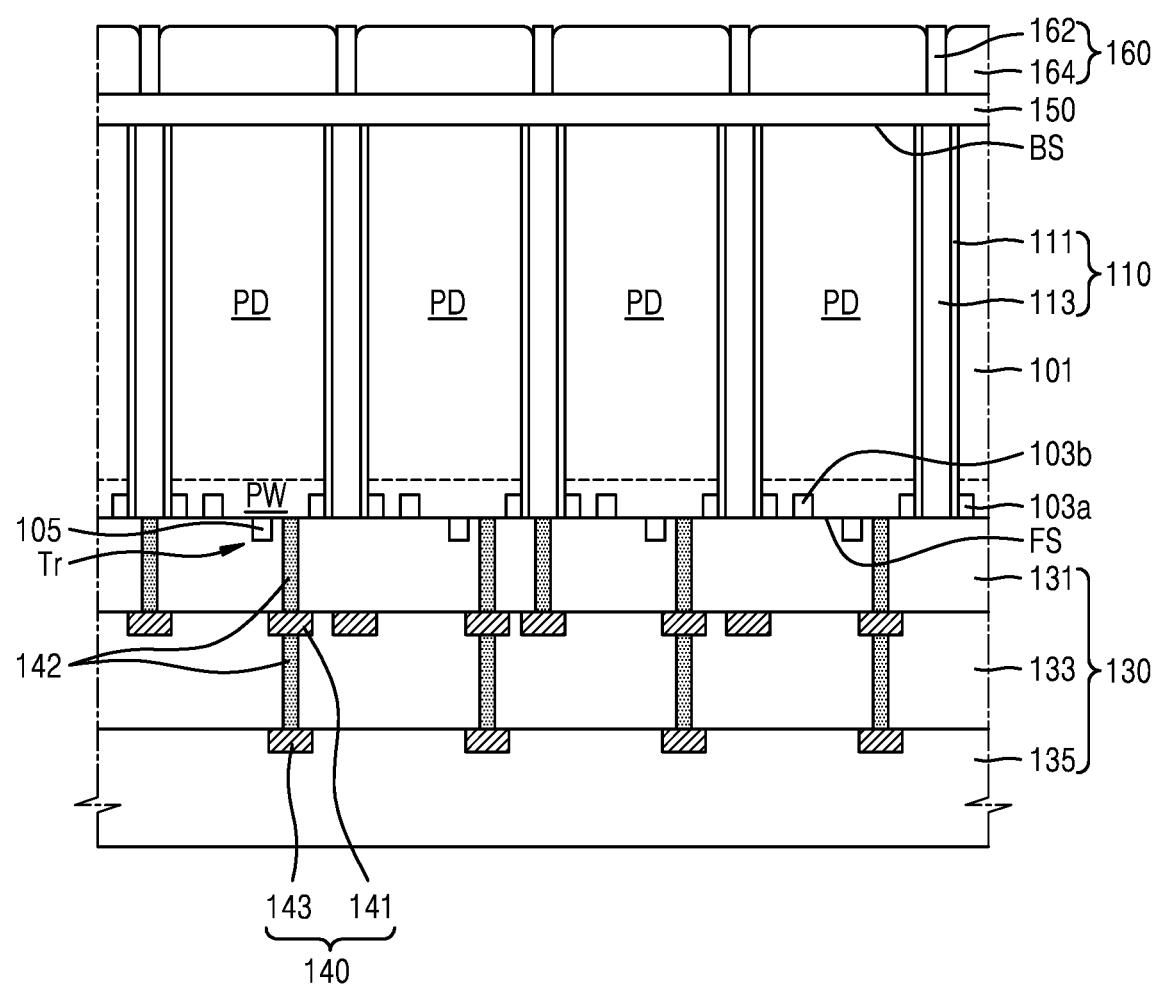

Referring to FIG. 5C, subsequently, a back side insulating layer 150 and a color filter layer 160 are formed on the back side BS of the substrate 101. The color filter layer 160 may include metal grids 162 and color filters 164. The back side insulating layer 150 may be disposed between the color filter layer 160 and the back side BS of the substrate 101. The metal grids 162 may be disposed between adjacent lenses to be discussed later.

Figure 5D:
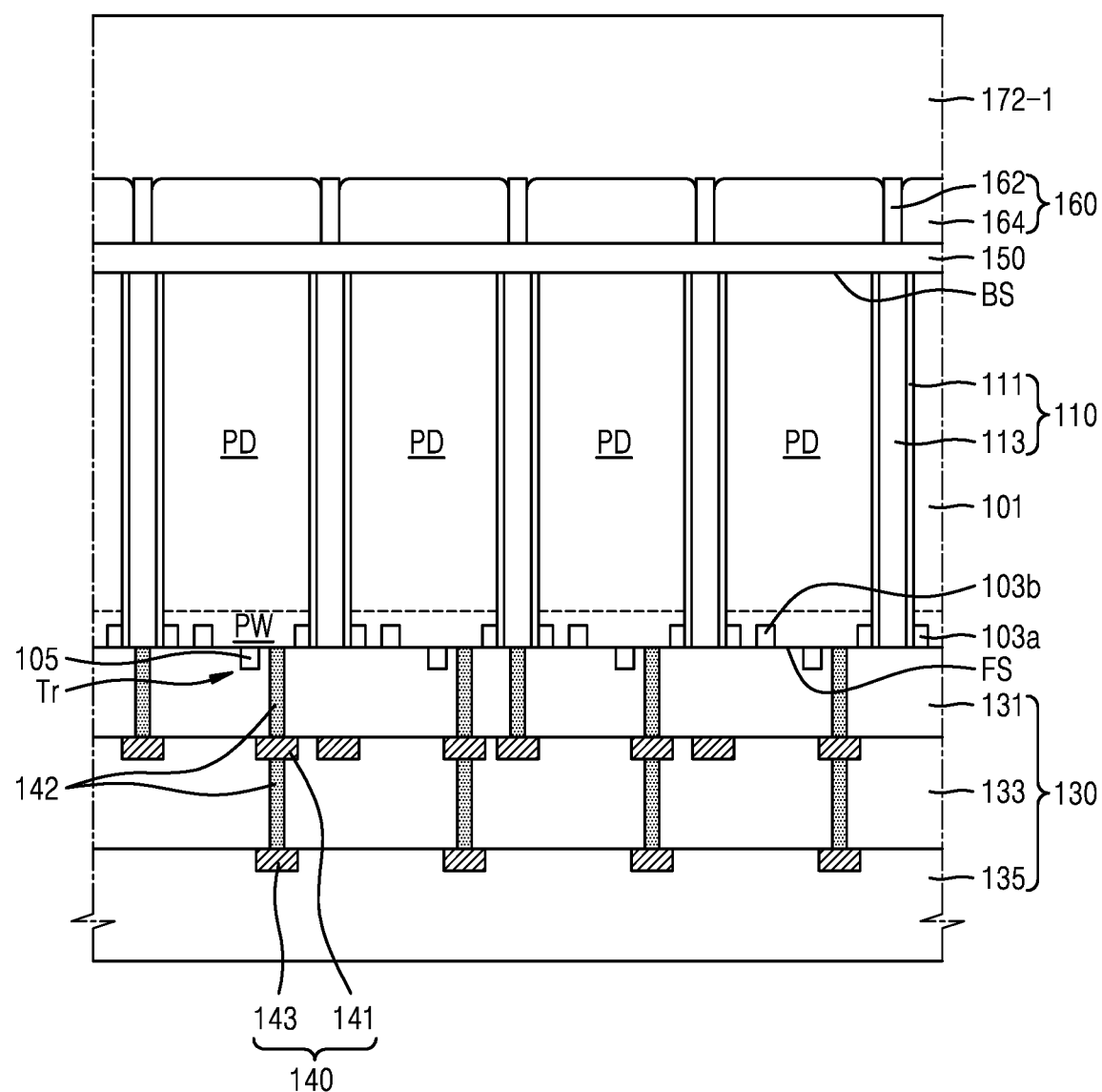

Referring to FIG. 5D, subsequently, a first material layer 172-1 is formed on the color filter layer 160. The first material layer 172-1 is a material layer for forming a planarization lens layer 172 and, as described above, may include a material having a refractive index of about 1.2 to about 1.8, for example, polyimide, $SiO_2$, or the like. Here, the refractive index or material of the first material layer 172-1 is not limited thereto. In addition, for the planarization, the first material layer 172-1 may be formed to be relatively thick or include a material having low viscosity.

Figure 5E:
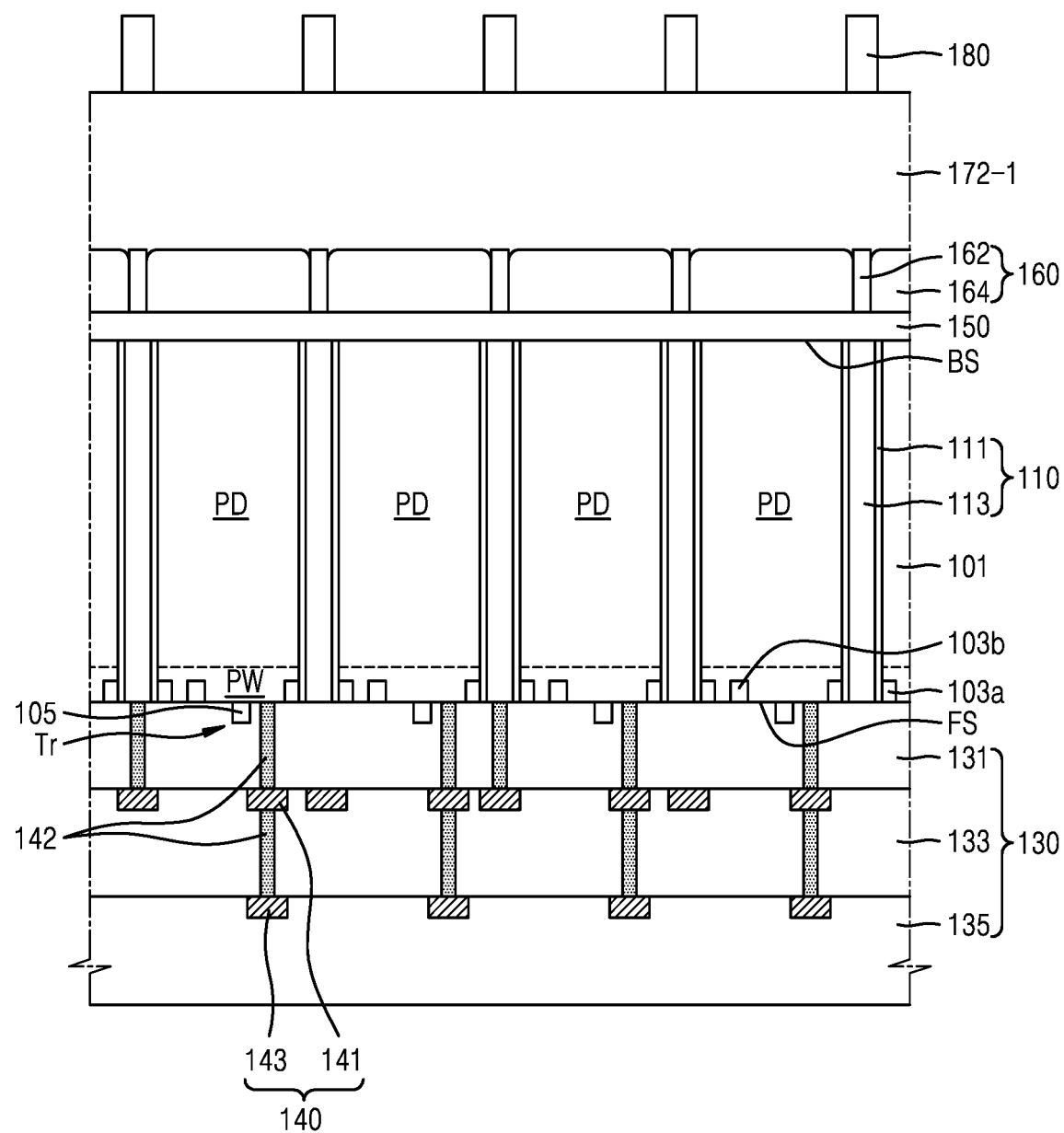

Referring to FIG. 5E, a first mask pattern 180 is formed on the first material layer 172-1. The first mask pattern 180 is formed by a photolithography process and may include a photosensitive resist, for example, a silicon oxide layer-based photosensitive resist. As illustrated in FIG. 5E, the first mask pattern 180 may be formed, at a position corresponding to each of the metal grids 162, having a relatively small width, for example, the width of about 100 nm to about 300 nm.

Figure 5F:
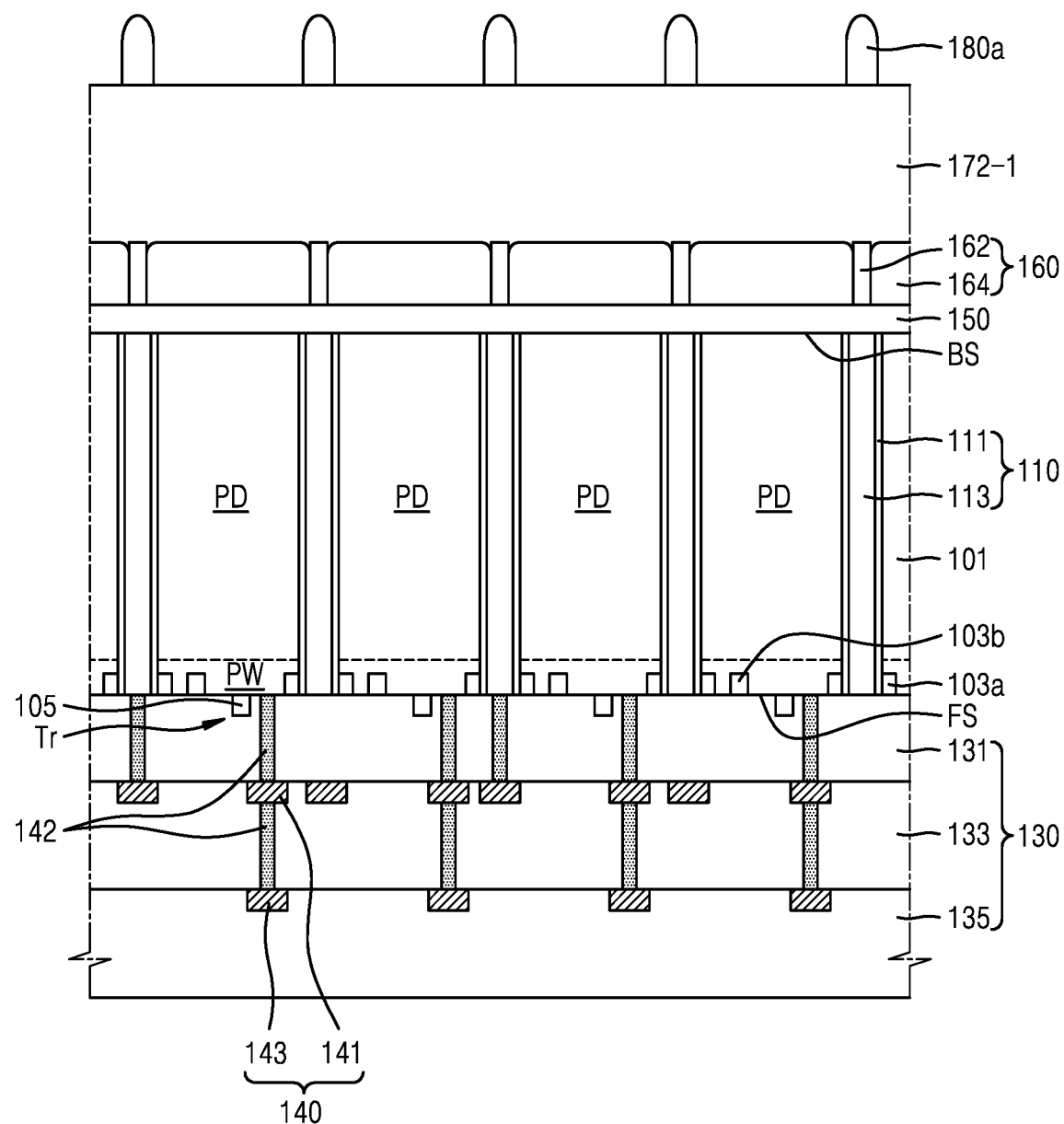

Referring to FIG. 5F, after the forming of the first mask pattern 180, a reflow process is performed to form a first reflow pattern 180a. The reflow process may be performed by using, for example, blank exposure in which a stepper is utilized. For example, when light having a certain wavelength is emitted to the first mask pattern 180 via the stepper, a photo active compound (PAC) component present in the mask pattern 180 is decomposed. Then, when a thermal process is performed, the reflow may be smoothly performed. Here, the thermal process may be performed at a temperature of about 150° C. for about 5 minutes. Here, the temperature and time of the thermal process is not limited to the values described above.

Figure 5G:
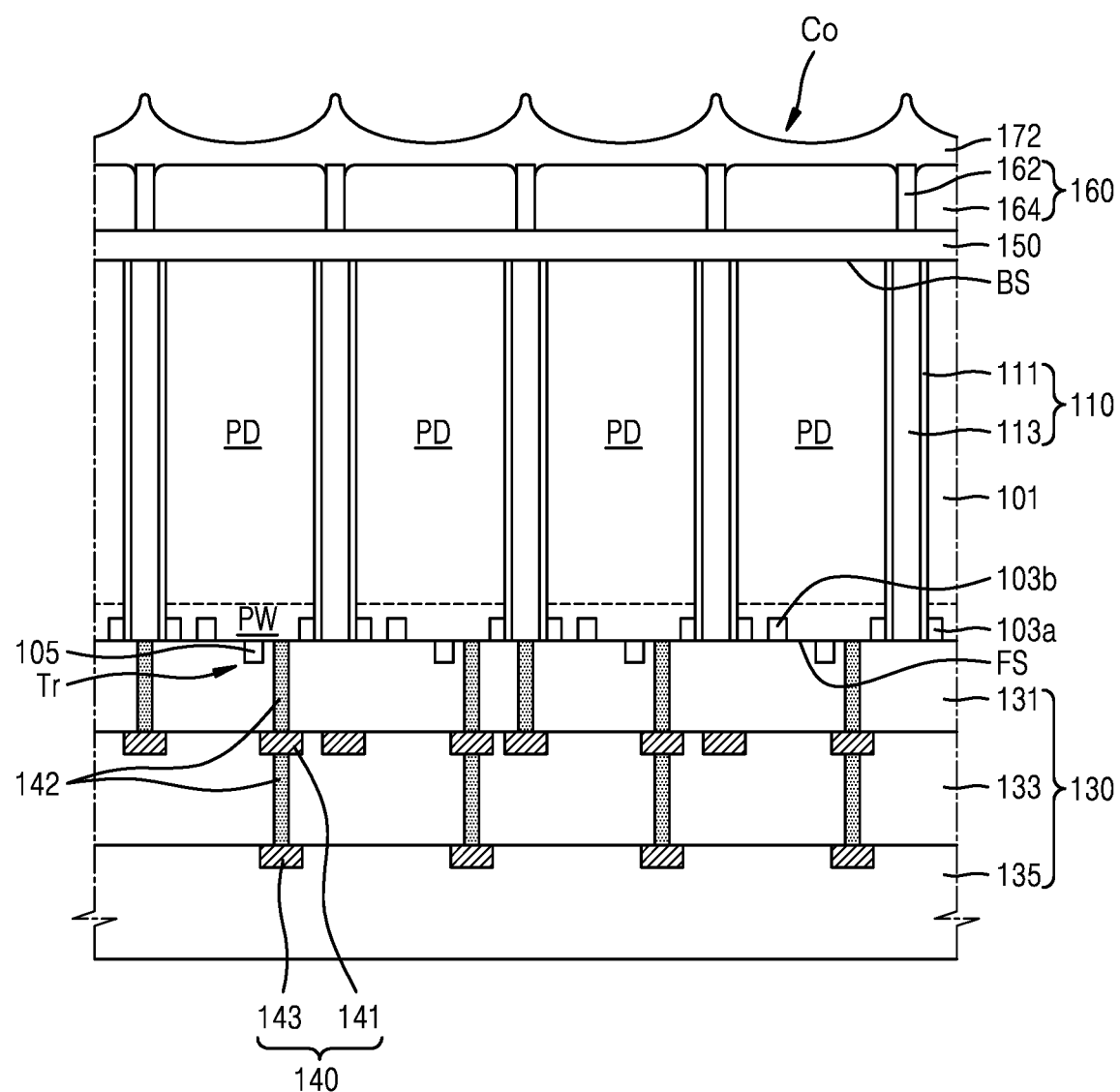

Referring to FIG. 5G, the planarization lens layer 172 is formed by using the first reflow pattern 180a as a mask and performing an etchback process. The etchback process may be performed until the first reflow pattern 180a is completely removed. Through the etchback process using the first reflow pattern 180a, recesses Co recessed downward may be formed in the planarization lens layer 172. In other words, after the etchback process, a portion of the planarization lens layer 172 corresponding to the first reflow pattern 180a may have a shape protruding upward, and a portion of the planarization lens layer 172 corresponding to between first reflow patterns 180a may have a shape of a recess Co. The portion of the planarization lens layer 172 protruding upward may be located over the metal grids 162 and situated between adjacent lenses to be described later.

Figure 5H:
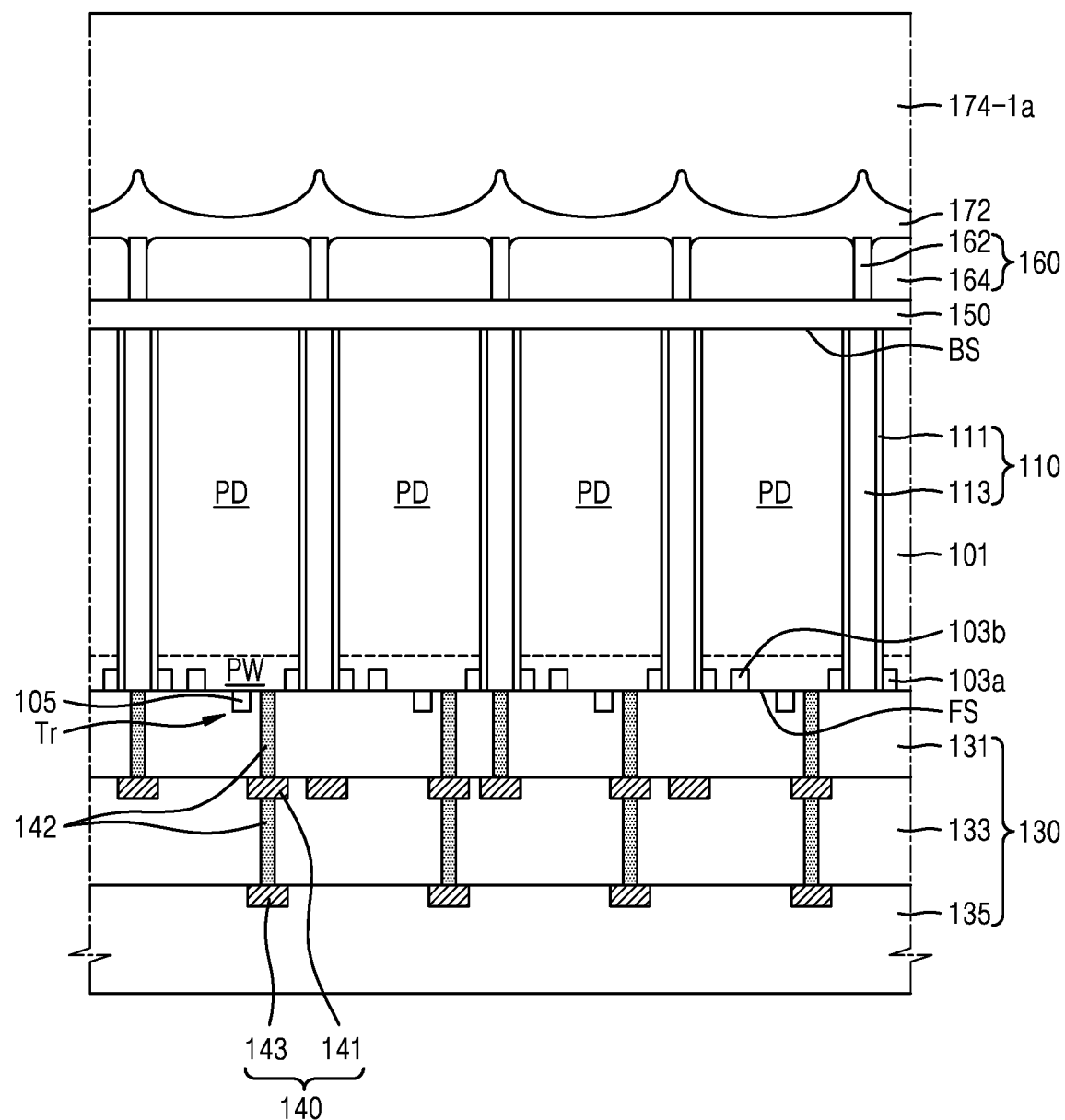

Referring to FIG. 5H, a second material layer 174-1a is formed on the planarization lens layer 172. The second material layer 174-1a may be a material layer for forming, for example, a lower spherical lens 174-1. Accordingly, the second material layer 174-1a may include a material having a refractive index of about 1.8 to about 2.5, for example, a material such as polyimide, SiN, $SiO_2$, SiON, HfOx, $TiO_2$, or the like. Here, the refractive index or material of the second material layer 174-1a is not limited thereto. In addition, the second material layer 172-1a may be formed to be relatively thick or include a material having low viscosity such that the top surface of the second material layer 174-1a is not affected by the shape of the top surface of the planarization lens layer 172 below.

Figure 5I:
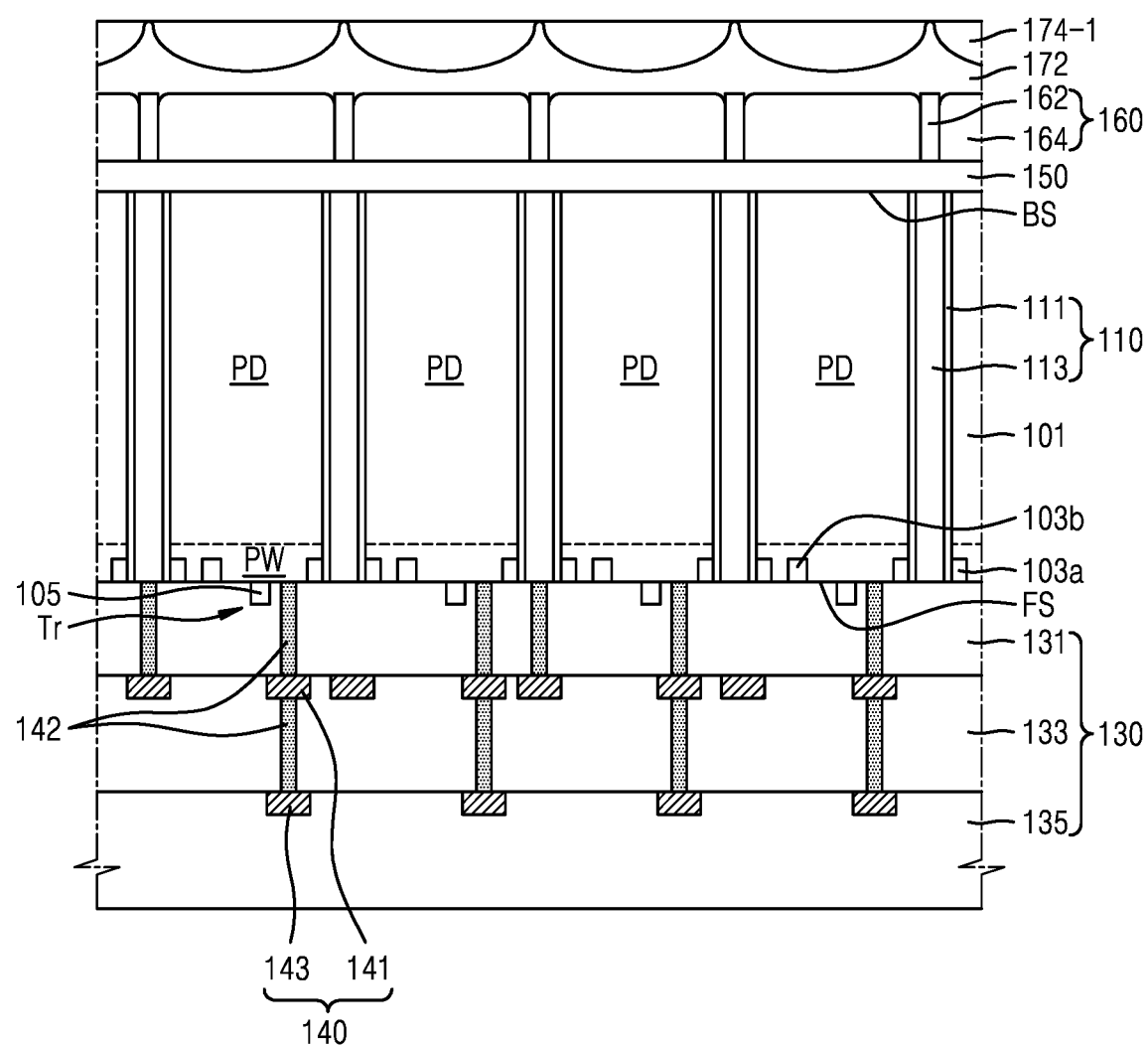

Referring to FIG. 5I, by performing an etchback process on the second material layer 174-1a, the only second material layer 174-1a remaining is located in the recesses Co of the planarization lens layer 172, and thus the lower spherical lens 174-1 protruding downward is formed. Here, according to an exemplary embodiment of the inventive concept, by filling the second material layer 174-1a having a low viscosity into the recesses Co of the planarization lens layer 172 and then curing the same, the lower spherical lens 174-1 may also be formed. In this case, an etchback process may be omitted.

Figure 5J:
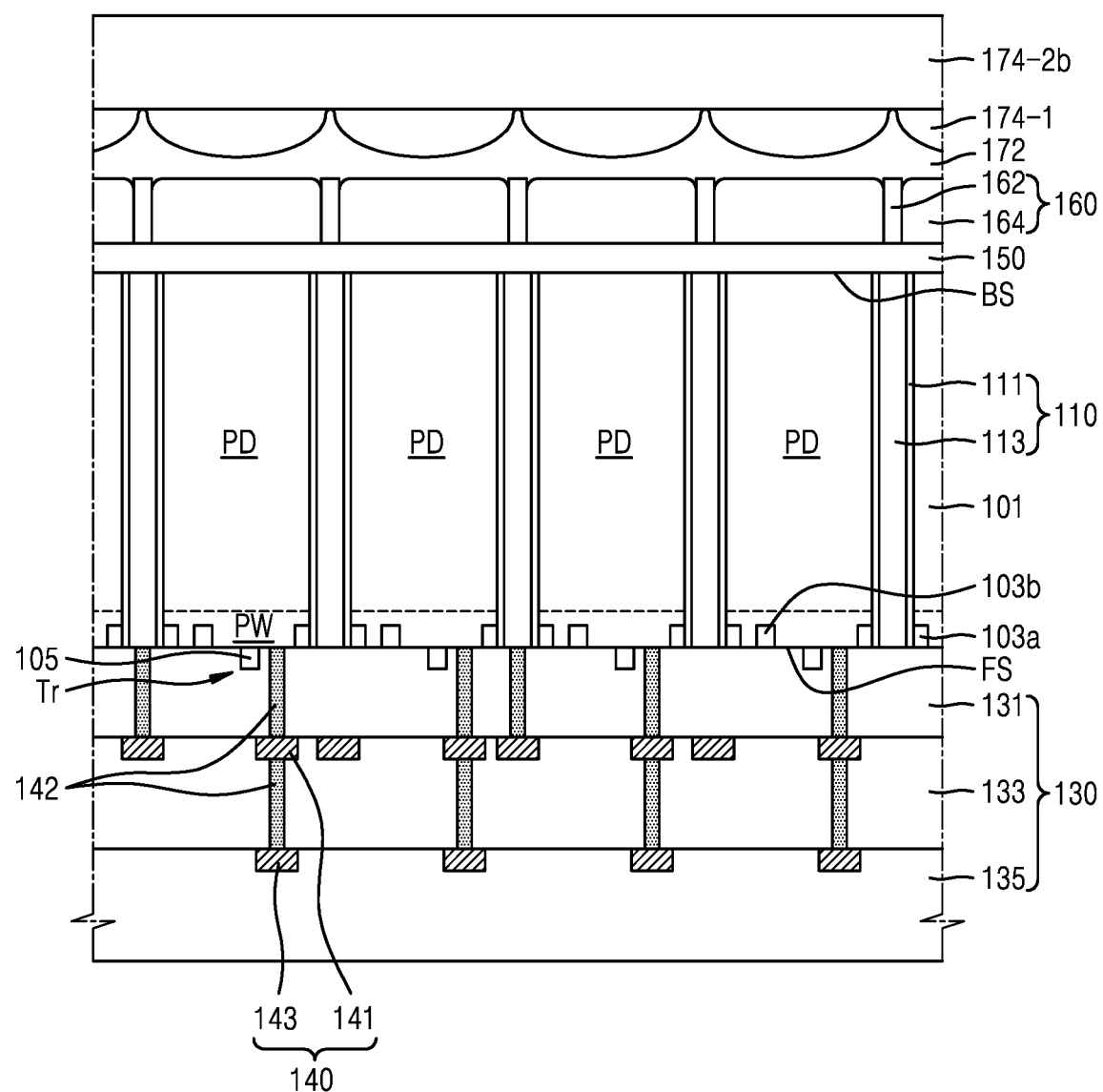

Referring to FIG. 5J, a third material layer 174-2b is formed on the lower spherical lens 174-1. The third material layer 174-2b may be a material layer for forming, for example, an upper spherical lens 174-2. Accordingly, the third material layer 174-2b may include a material having a refractive index of about 1.4 to about 1.8, for example, a material such as polyimide, $SiO_2$, $Al_2O_3$, or the like. Here, the refractive index or material of the third material layer 174-2b is not limited thereto.

Figure 5K:
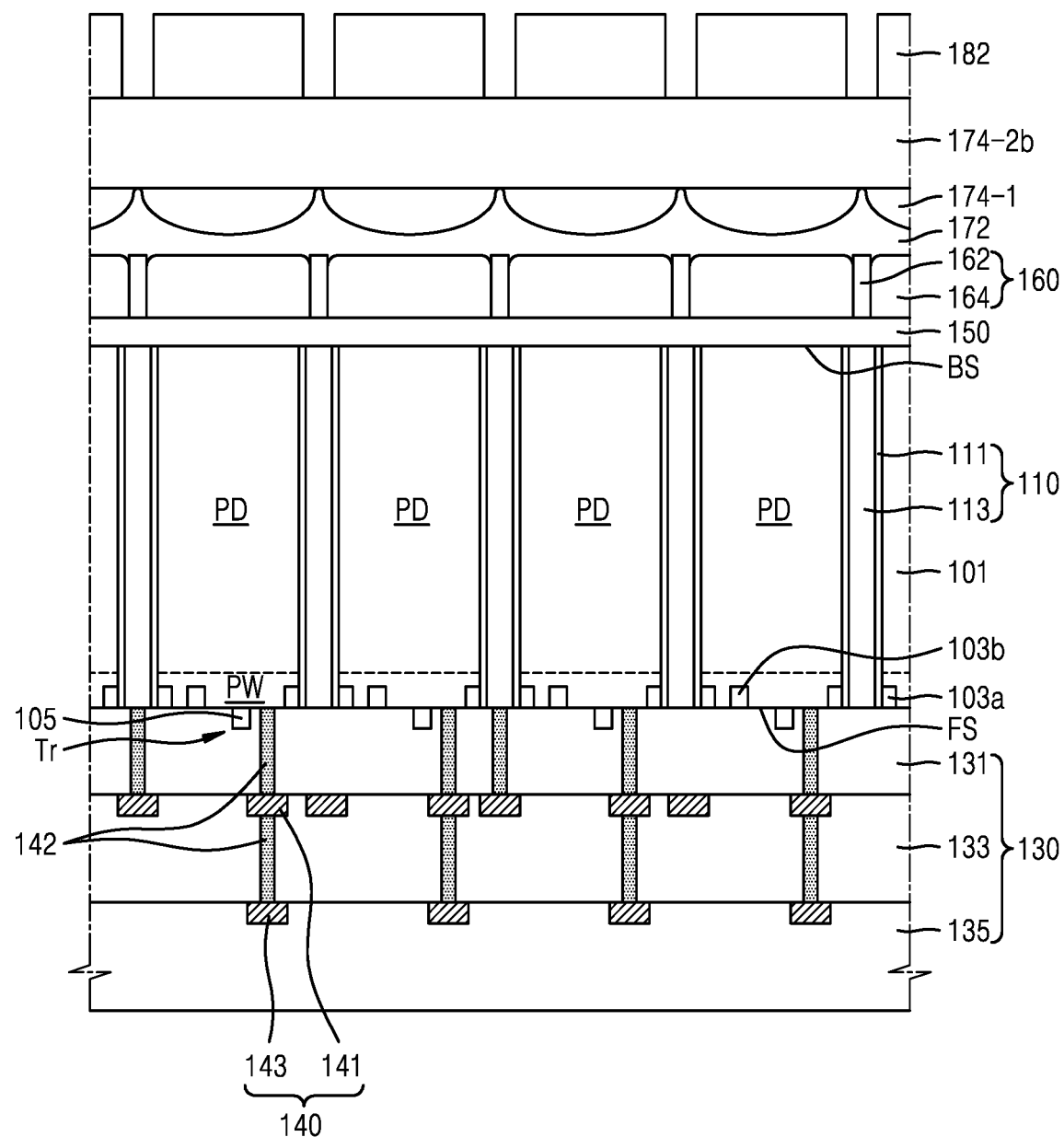

Referring to FIG. 5K, a second mask pattern 182 is formed on the third material layer 174-2b. The second mask pattern 182 is formed by a photolithography process and may include a photosensitive resist like the first mask pattern 180. Here, as illustrated in FIG. 5K, the second mask pattern 182 is formed at a position corresponding to the lower spherical lens 174-1, but is not formed in a portion between lower spherical lenses 174-1, in other words, in a portion corresponding to a protrusion of the planarization lens layer 172. The second mask pattern 182 may be formed having a relatively large width, for example, the width of about 1000 nm. Here, the width of the second mask pattern 182 is not limited thereto.

Figure 5L:
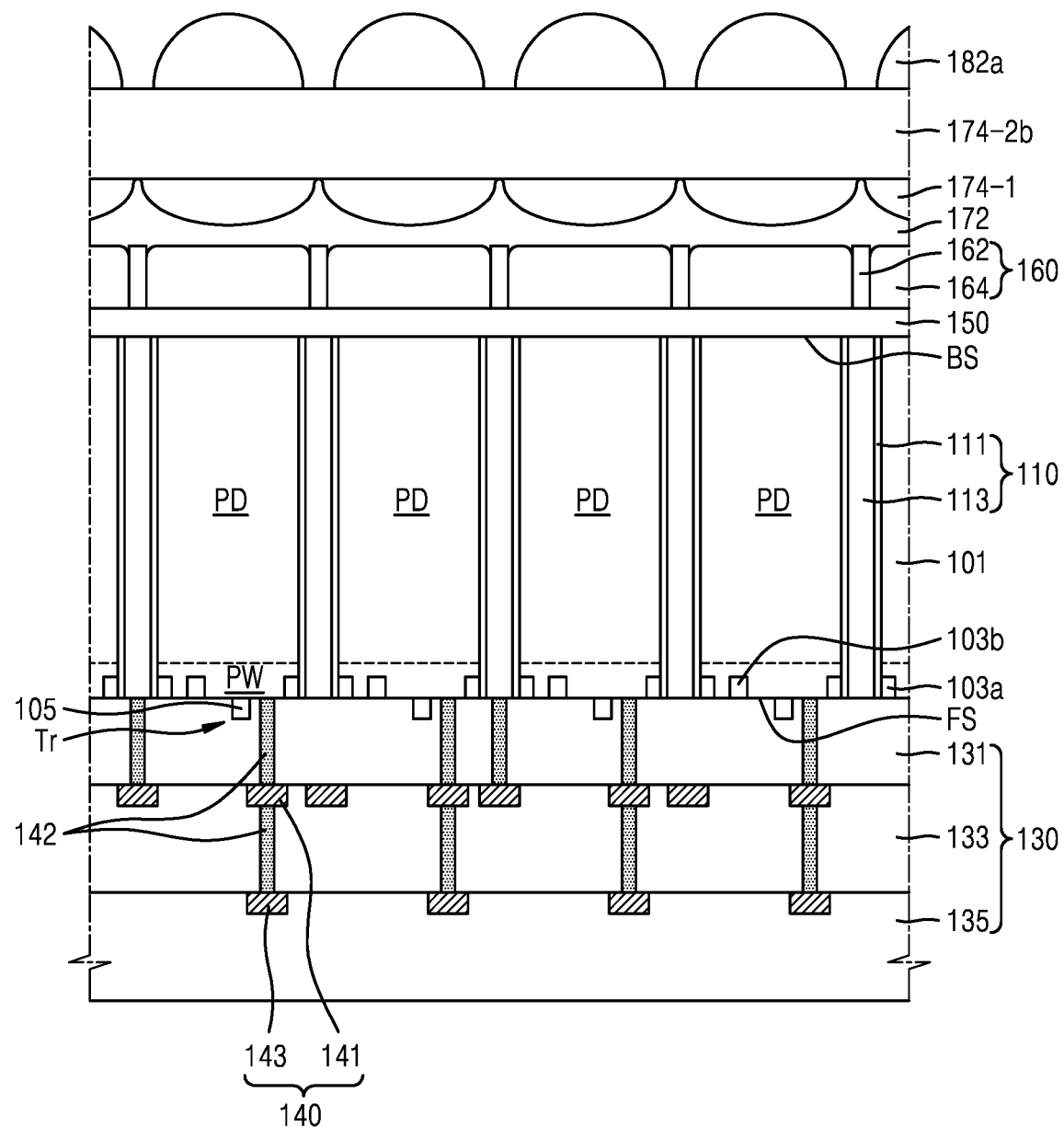

Referring to FIG. 5L, after the formation of the second mask pattern 182, a reflow process is performed to form a second reflow pattern 182a. The reflow process on the second mask pattern 182 may also be performed through, for example, blank exposure using a stepper and a thermal process. As illustrated in FIG. 5L, the second reflow pattern 182a formed through the reflow process may have a shape similar to hemispheres which are separated from each other.

However, according to an exemplary embodiment of the inventive concept, second reflow patterns 182a may be in contact with each other.

Figure 5M:
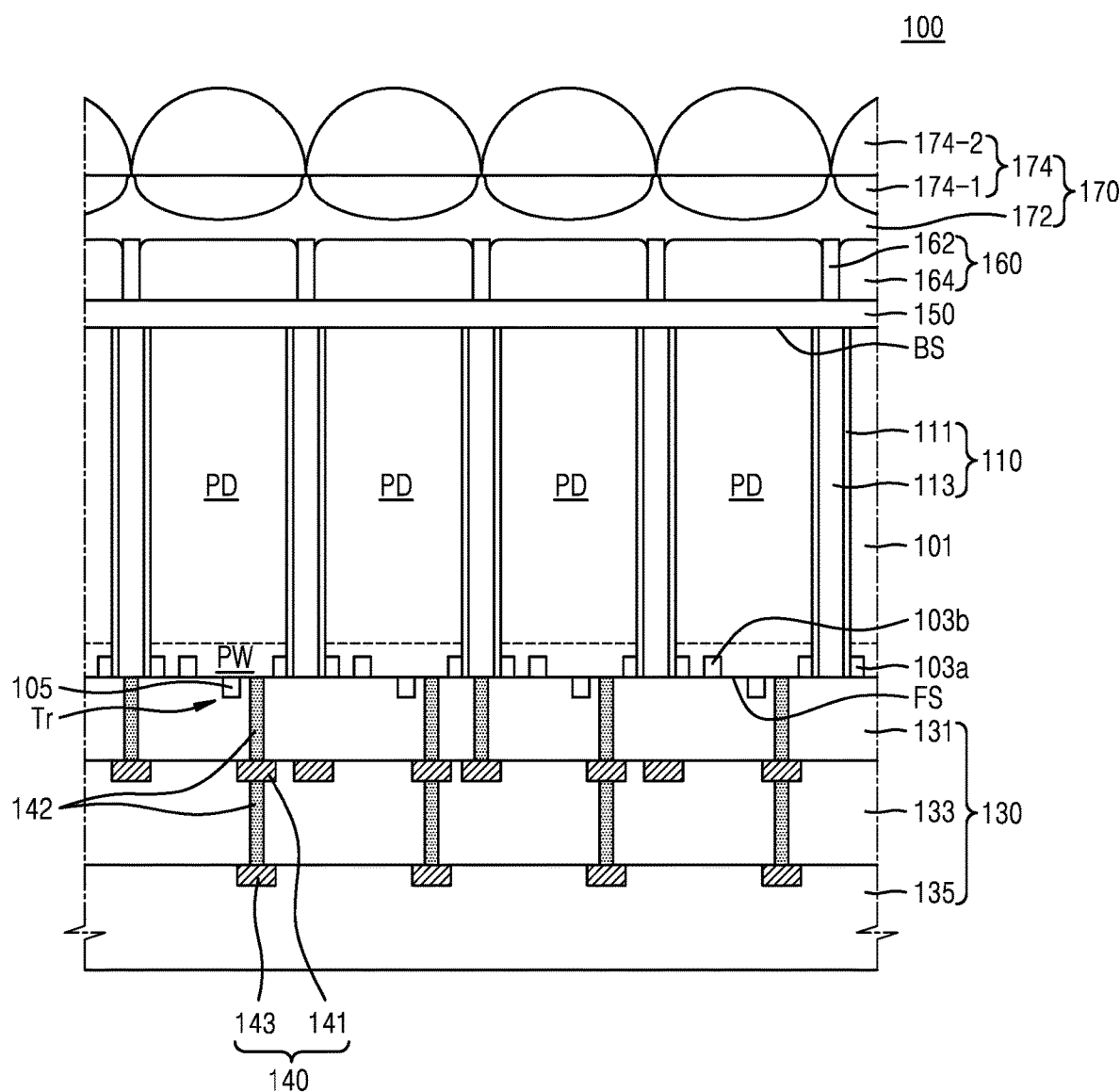

Referring to FIG. 5M, the upper spherical lens 174-2 is formed by using the second reflow pattern 182a as a mask and performing an etchback process. The etchback process may be performed until the second flow pattern 182a is completely removed. Through the etchback process using the second reflow pattern 182a, the upper spherical lens 174-2 may have a structure protruding upward. In other words, since the shape of the second reflow pattern 182a is transferred as is to the third material layer 174-2b through the etchback process, the upper spherical lens 174-2 may be formed with the shape similar to that of the second reflow pattern 182a.

Since the upper spherical lens 174-2 is formed through the etchback process, the image sensor 100 of FIG. 1 is completed. In other words, since the upper spherical lens 174-2 is formed, the double-sided spherical lens 174 including the lower spherical lens 174-1 and the upper spherical lens 174-2 is completed. Thus, the lens layer 170 including the planarization lens layer 172 and the double-sided spherical lens 174 may be completed.

FIGS. 6A to 6E are cross-sectional views schematically showing processes in a method of manufacturing the image sensor of FIG. 3A, according to an exemplary embodiment of the inventive concept. The descriptions of FIGS. 6A to 6E are made with reference to FIG. 3A together, and thus, the descriptions given above with reference to FIGS. 3A and 5A to 5M may be briefly given or omitted.

Figure 6A:
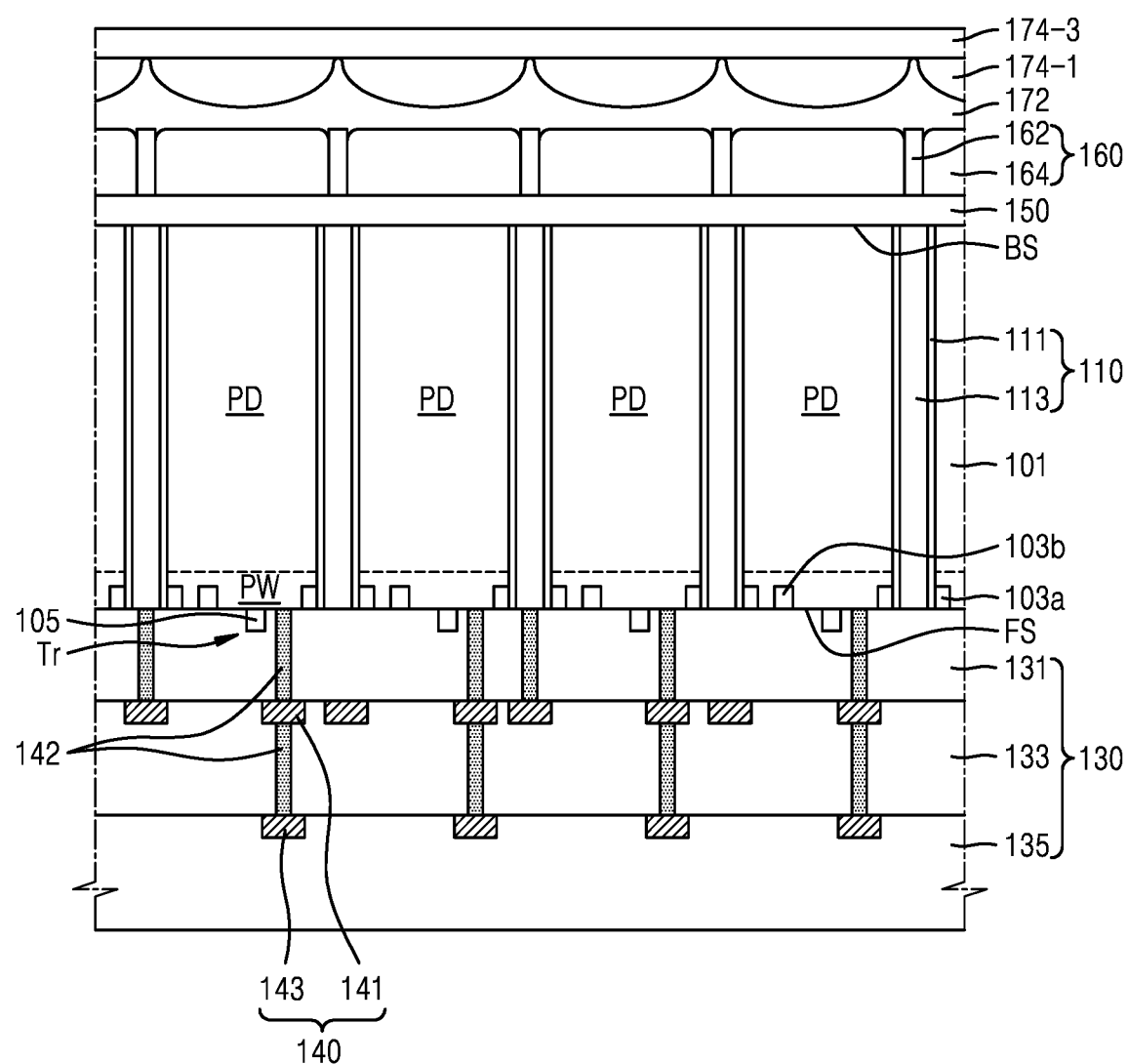
FIGS. 6A, 6B, 6C, 6D and 6E are cross-sectional views schematically showing processes in a method of manufacturing the image sensor of FIG. 3A, according to an exemplary embodiment of the inventive concept.

Referring to FIG. 6A, firstly, a planarization lens layer 172 and a lower spherical lens 174-1 are formed on the color filter layer 160 through the processes of FIGS. 5A to 5I. For example, the planarization lens layer 172 may be formed directly on the color filter layer 160. Subsequently, an intermediate lens 174-3 may be formed on the lower spherical lens 174-1. For example, the intermediate lens 174-3 may be formed directly on the lower spherical lens 174-1. The intermediate lens 174-3 may be integrally formed having a flat plate shape and may be relatively thin.

For example, the intermediate lens 174-3 may include a material having a refractive index between a refractive index of the lower spherical lens 174-1 and a refractive index of an upper spherical lens 174-2. For example, the intermediate lens 174-3 may include one of materials included in the lower spherical lens 174-1 and the upper spherical lens 174-2. Here, the material of the intermediate lens 174-3 is not limited thereto. Here, the intermediate lens 174-3 may be formed to have a thickness of 100 nm or less, for example, tens of nanometers, and the intermediate lens 174-3 may contribute to improving light collection efficiency by preventing reflection.

Figure 6B:
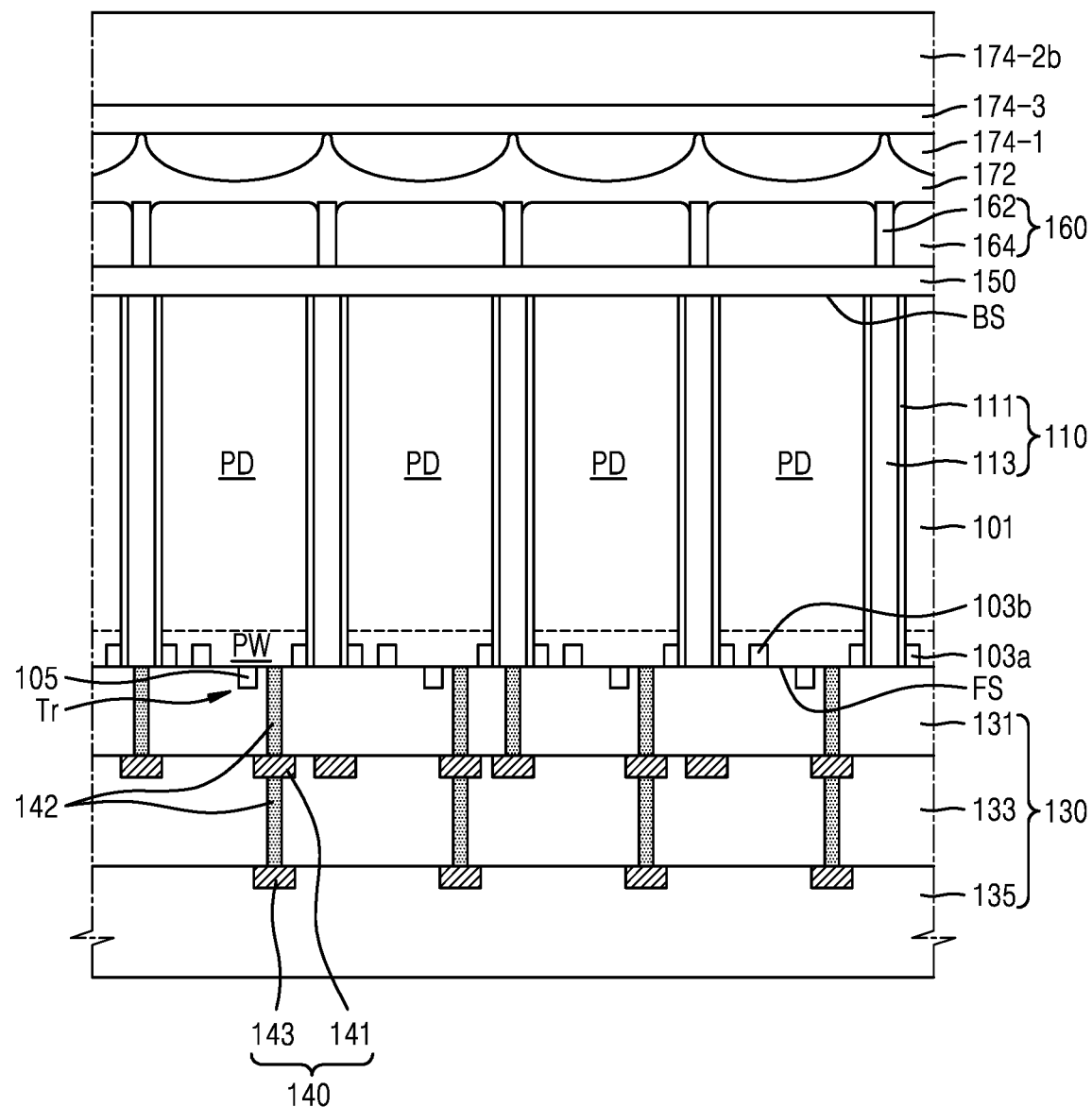

Referring to FIG. 6B, a third material layer 174-2b is formed on the intermediate lens 174-3. The third material layer 174-2b may be a material layer for forming the upper spherical lens 174-2. The third material layer 174-2b is the same as that described in FIG. 5J.

Figure 6C:
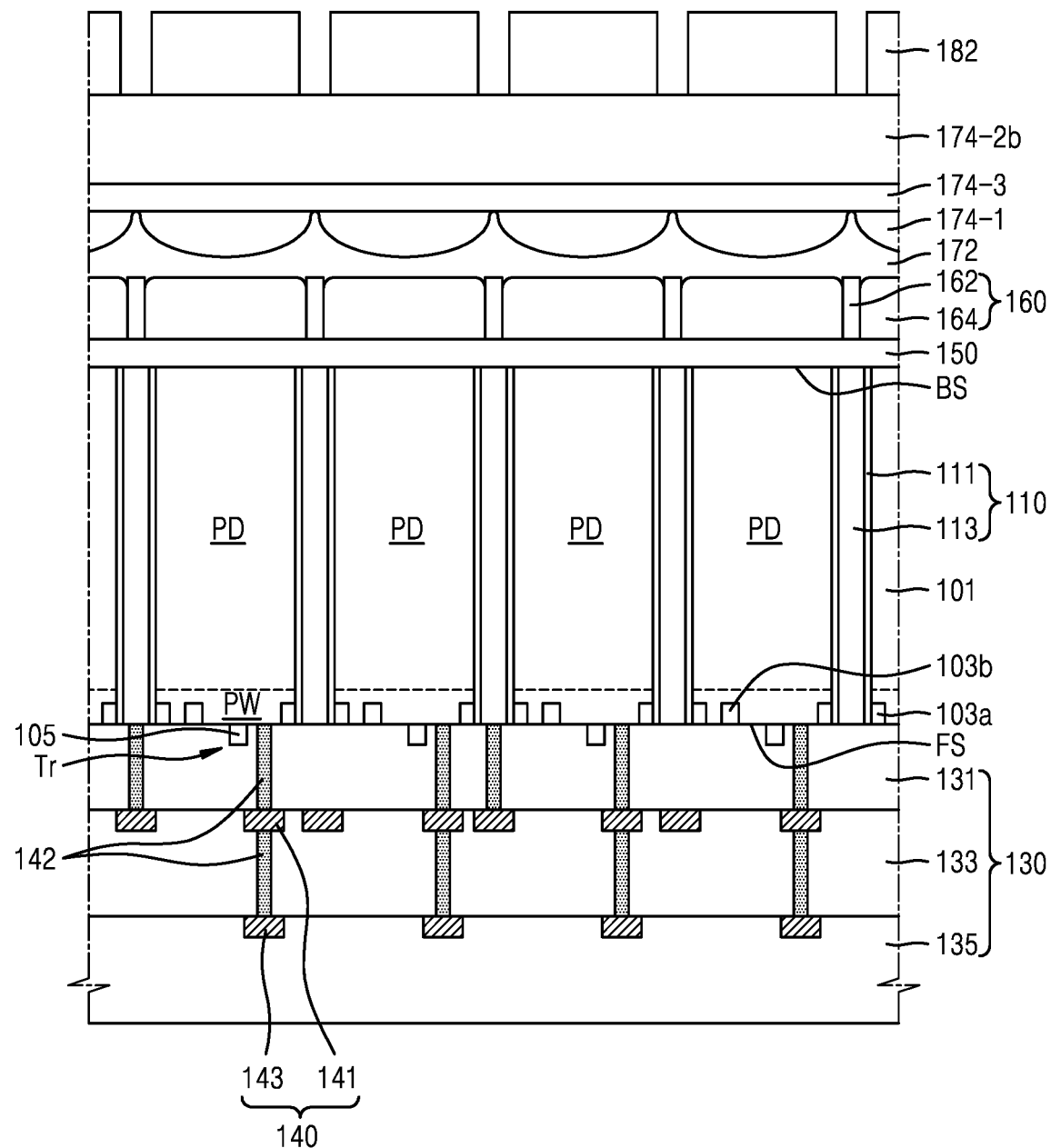

Referring to FIG. 6C, a second mask pattern 182 is formed on the third material layer 174-2b. The second mask pattern 182 is formed by a photolithography process and may include a photosensitive resist. The forming of the second mask pattern 182 is the same as that described in FIG. 5K.

Figure 6D:
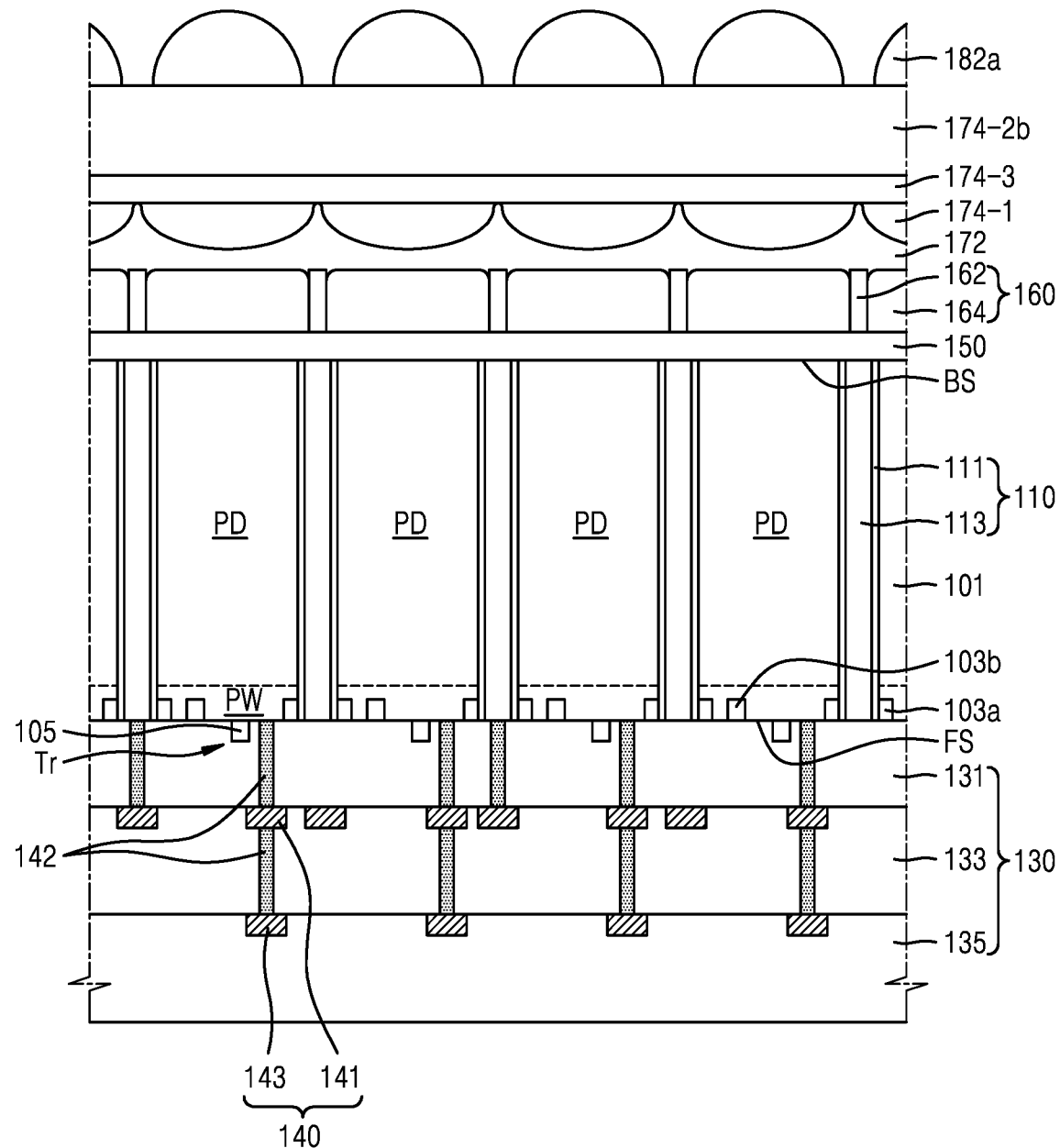

Referring to FIG. 6D, after the forming of the second mask pattern 182, a reflow process is performed to form a second reflow pattern 182a. The forming of the second reflow pattern 182a is the same as that described in FIG. 5L.

Figure 6E:
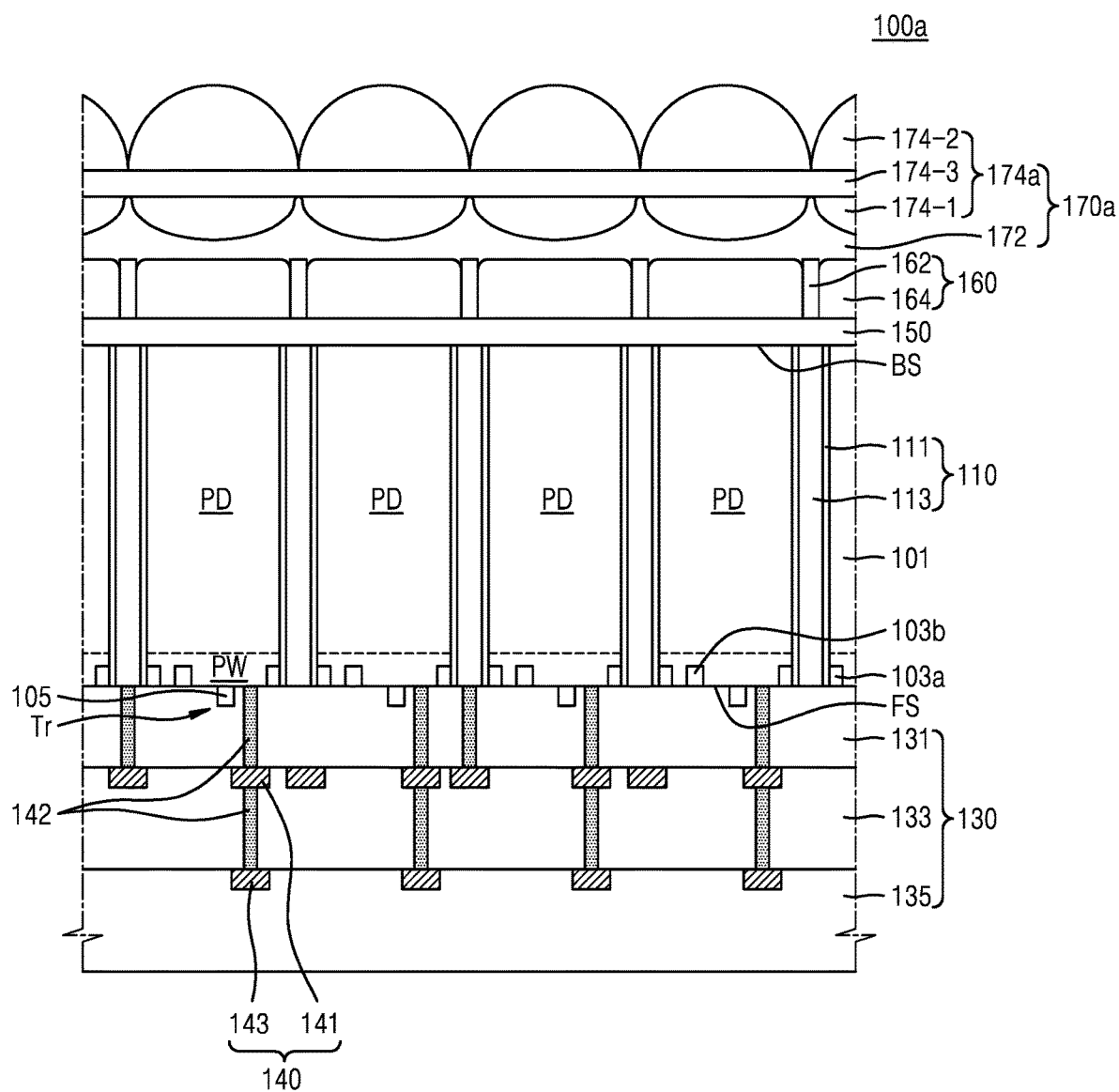

Referring to FIG. 6E, the upper spherical lens 174-2 is formed by using the second reflow pattern 182a as a mask and performing an etchback process. The forming of the upper spherical lens 174-2 is the same as that described in FIG. 5M. After the upper spherical lens 174-2 is formed through the etchback process, the image sensor 100a of FIG. 3A may be completed. In other words, as the upper spherical lens 174-2 is formed, the double-sided spherical lens 174a including the lower spherical lens 174-1, the intermediate lens 174-3, and the upper spherical lens 174-2 is completed. Thus, the lens layer 170a including the planarization lens layer 172 and the double-sided spherical lens 174a may be completed.

FIGS. 7A to 7D are cross-sectional views schematically showing processes in a method of manufacturing the image sensor of FIG. 3B, according to an exemplary embodiment of the inventive concept. The descriptions of FIGS. 7A to 7D are made with reference to FIG. 3B together, and thus, the descriptions given above with reference to FIGS. 3B and 5A to 6E may be briefly given or omitted.

Figure 7A:
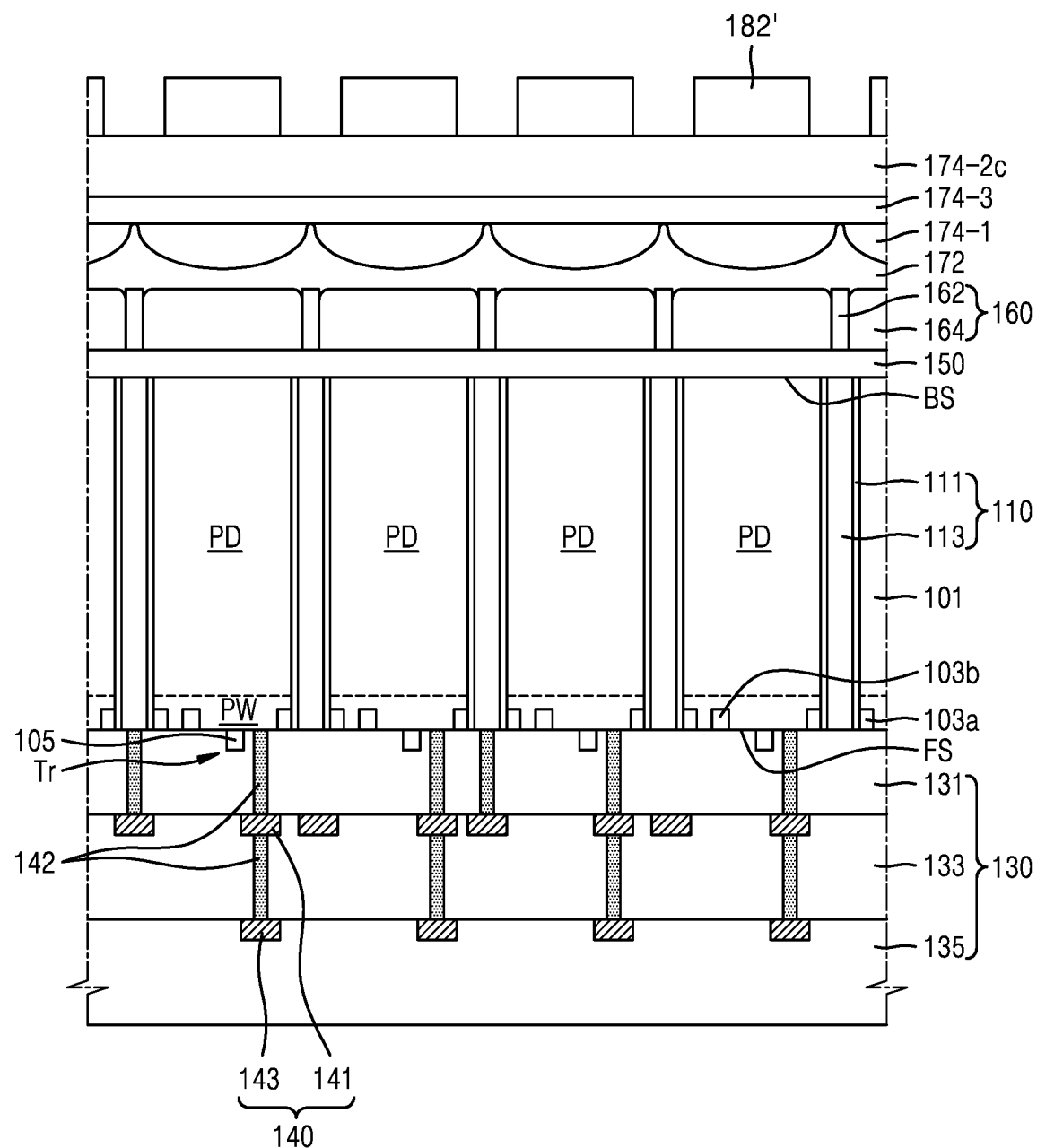
FIGS. 7A, 7B, 7C and 7D are cross-sectional views schematically showing processes in a method of manufacturing the image sensor of FIG. 3B, according to an exemplary embodiment of the inventive concept.

Referring to FIG. 7A, first, a third material layer 174-2c is formed on an intermediate lens 174-3 through the processes of FIGS. 6A to 6B. The third material layer 174-2c may be a material layer for forming an upper spherical lens 174-2a and may include the same material as the third material layer 174-2b of FIG. 5J or FIG. 6B as described above. However, in the method of manufacturing the image sensor in the present embodiment, the third material layer 174-2c may be formed to be thinner than the third material layer 174-2b of FIG. 5J or FIG. 6B. However, according to an exemplary embodiment of the inventive concept, the third material layer 174-2c may be formed to have substantially the same thickness as the third material layer 174-2b of FIG. 5J or FIG. 6B.

Subsequently, a second mask pattern 182' is formed on the third material layer 174-2c. The second mask pattern 182' may include the same material as the second mask pattern 182 of FIG. 5K or FIG. 6C, for example, a photosensitive resist. However, as illustrated in FIG. 7A, in the method of manufacturing the image sensor in the present embodiment, the second mask pattern 182' may have a smaller size than the second mask pattern 182 of FIG. 5K or FIG. 6C. However, according to an exemplary embodiment of the inventive concept, the second mask pattern 182' may have substantially the same size as the second mask pattern 182 of FIG. 5K or FIG. 6C.

Figure 7B:
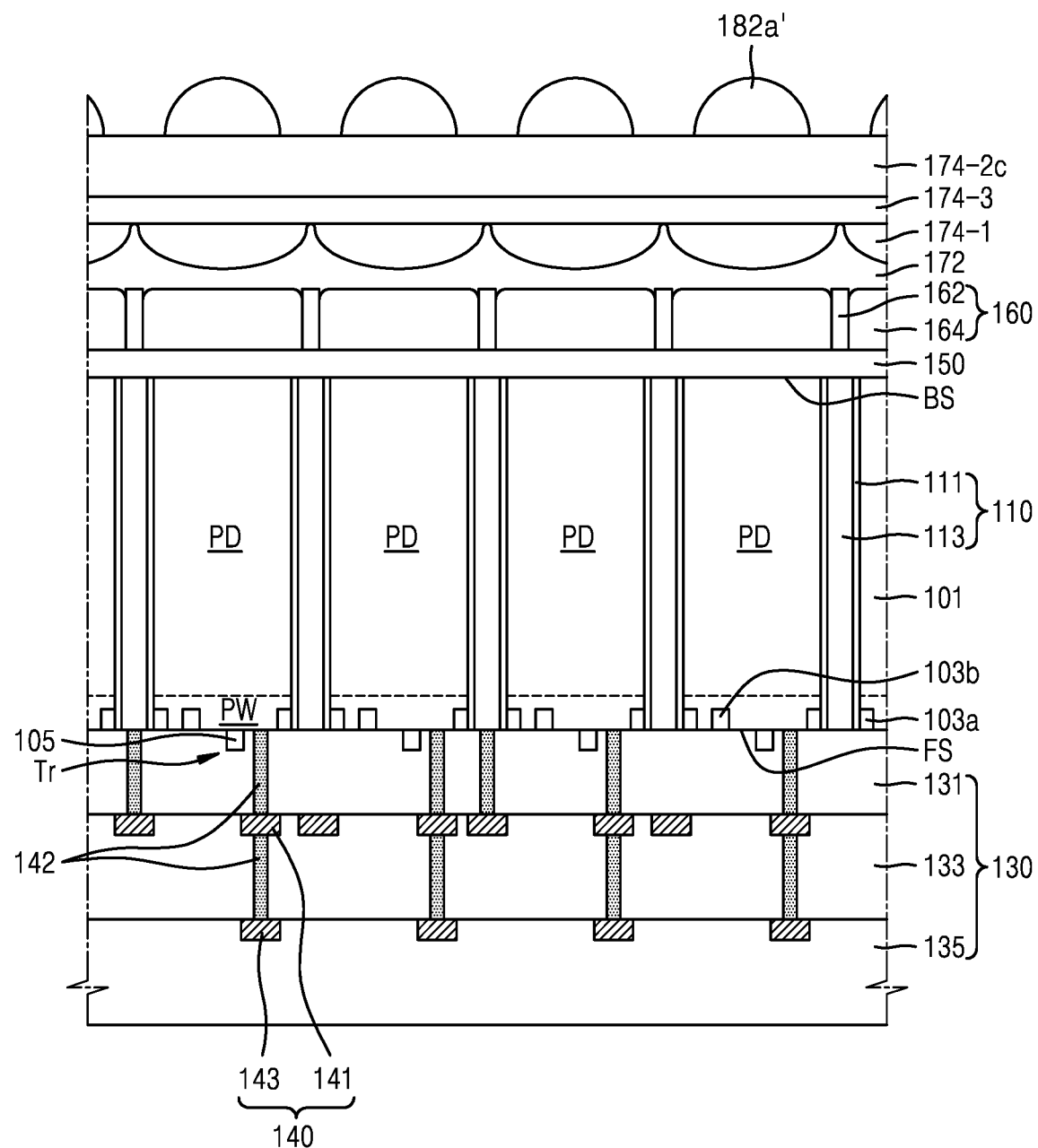

Referring to FIG. 7B, after the forming of the second mask pattern 182', a reflow process is performed to form a second reflow pattern 182a'. Because the size of the second mask pattern 182' is small, the size of the second reflow pattern 182a' may also be small. In addition, a thermal process time may be short, corresponding to a small size of the second mask pattern 182'. However, when the second mask pattern 182' has the same size as the second mask pattern 182 of FIG. 5K or FIG. 6C, the thermal process time is maintained as is and the second reflow pattern 182a' may have substantially the same size as the second reflow pattern 182a of FIG. 5L or FIG. 6D.

Figure 7C:
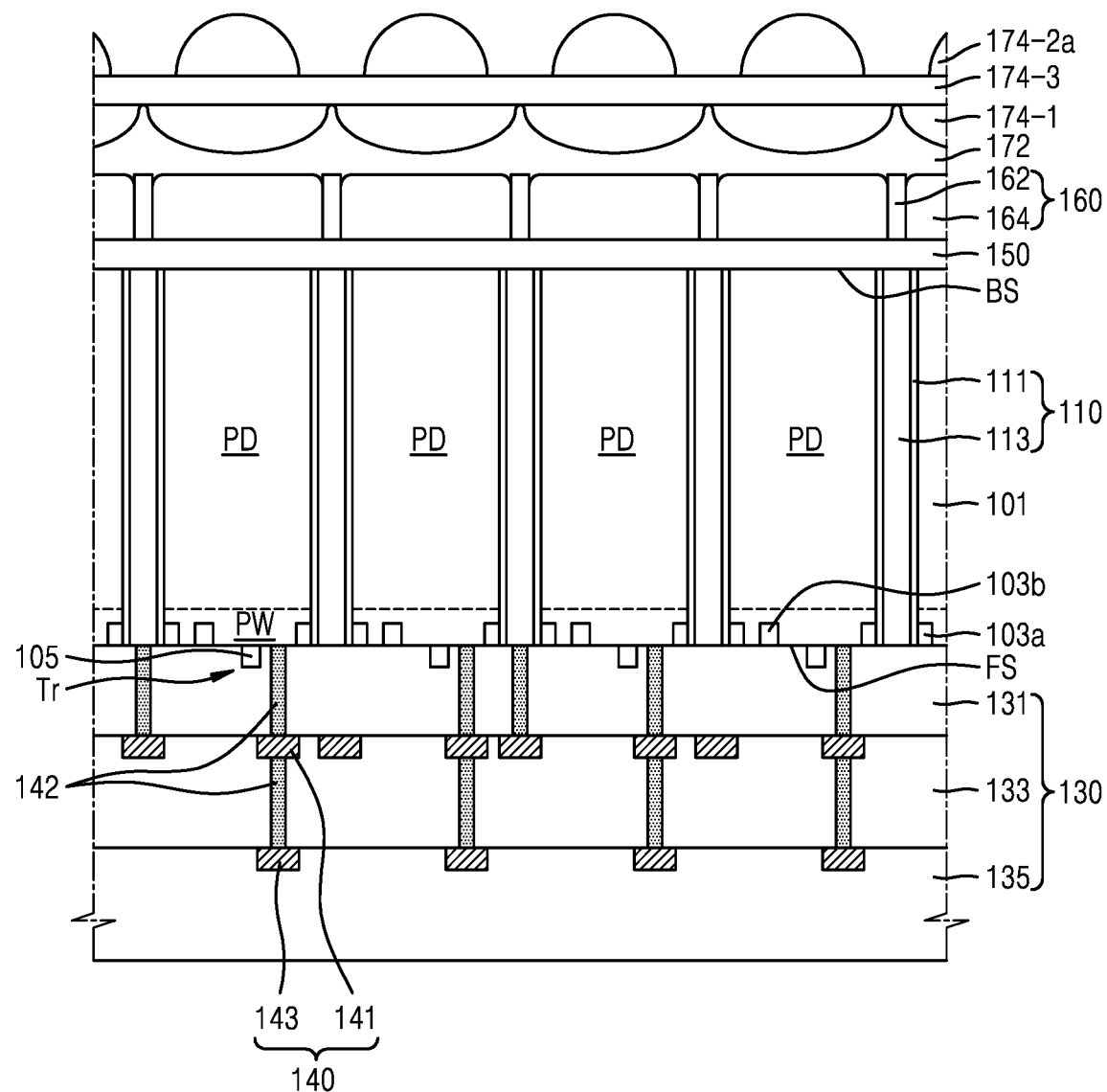

Referring to FIG. 7C, an upper spherical lens 174-2a is formed by using the second reflow pattern 182a' as a mask and performing an etchback process. In the method of manufacturing the image sensor in the present embodiment, the thickness of the third material layer 174-2c is small, and the size of the second reflow pattern 182a' is small. Thus, the upper spherical lens 174-2a may have a smaller size than the upper spherical lens 174-2 of FIG. 5M or FIG. 6E. In addition, as described above, according to an exemplary embodiment of the inventive concept, the third material layer 174-2c is thick, and the second reflow pattern 182a' has the large size. In these embodiments, by increasing an etchback process time, an upper spherical lens 174-2a having a small size may be formed.

Figure 7D:
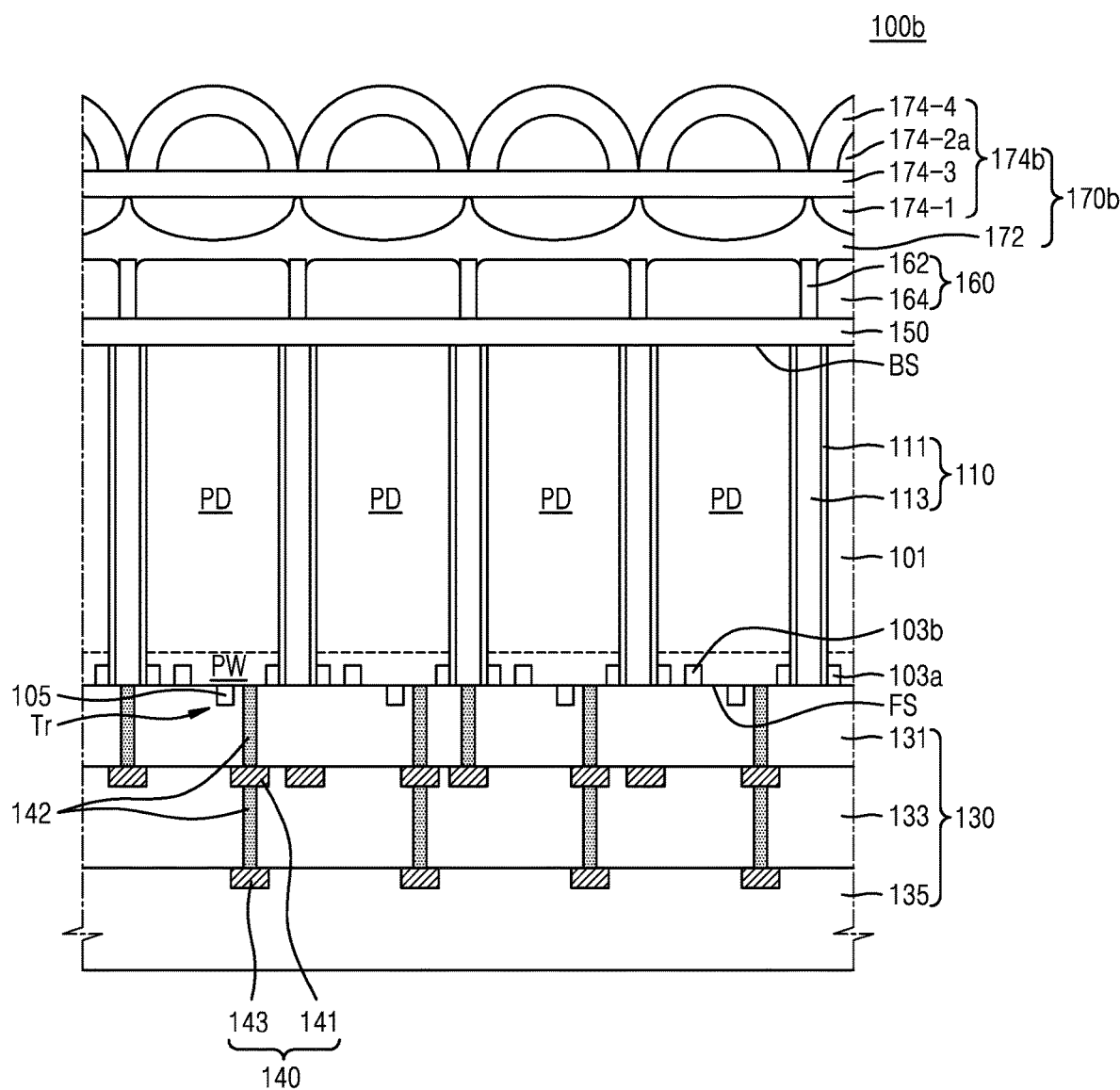

Referring to FIG. 7D, after the forming of the upper spherical lens 174-2a, a cover lens 174-4 is formed on the upper spherical lens 174-2a. For example, by forming a material layer for the cover lens on the upper spherical lens 174-2a to a uniform thickness and by curing the same, the cover lens 174-4 may be formed. The cover lens 174-4 may be relatively thin and include a material having a low refractive index. For example, the cover lens 174-4 may have a thickness of about 100 nm and include polyimide, $SiO_2$, or the like having a refractive index of about 1.0 to about 1.4. Here, the thickness, refractive index, and material of the cover lens 174-4 are not limited to those described above. Since the cover lens 174-4 is thin and has the low refractive index, the cover lens 174-4 may serve as an anti-reflection layer.

Exemplary embodiments of the inventive concept provide an image sensor capable of improving light collection efficiency and reducing crosstalk, in particular, optical crosstalk, and a method of manufacturing the same.

While the inventive concept has been particularly shown and described with reference to exemplary embodiments thereof, it will be understood that various changes in form and details may be made thereto without departing from the spirit and scope of the inventive concept as set forth in the following claims.

What is claimed is:

1. An image sensor, comprising:
a substrate which has a first surface and a second surface opposite to the first surface and pixels arranged in a two-dimensional array, wherein each of the pixels comprises a photodiode (PD);
a multi-wiring layer arranged on the first surface of the substrate;
a color filter layer arranged on the second surface of the substrate and comprising color filters that respectively correspond to the pixels; and
a lens layer arranged on the color filter layer and comprising a double-sided spherical lens,
wherein the double-sided spherical lens comprises at least two material layers having different refractive indexes,
wherein the double-sided spherical lens comprises a lower spherical lens, an upper spherical lens, and an intermediate lens having a flat plate shape and arranged between the lower spherical lens and the upper spherical lens,
a refractive index of the lower spherical lens is greater than a refractive index of the upper spherical lens, and
the intermediate lens has a uniform thickness and has a refractive index between the refractive index of the lower spherical lens and the refractive index of the upper spherical lens,
wherein the lens layer further comprises a planarization lens layer adjacent to the lower spherical lens, and
the double-sided spherical lens further comprises a cover lens having a uniform thickness and covering the upper spherical lens,
wherein a refractive index of the cover lens is less than a refractive index of the planarization lens layer, and the refractive index of the upper spherical lens is greater than that of the planarization lens layer.

2. The image sensor of claim 1, wherein the planarization lens layer is between the double-sided spherical lens and the color filter layer, and
a top surface of the planarization lens layer has recesses, each of which is recessed to correspond to a surface of the double-sided spherical lens.

3. The image sensor of claim 1, wherein the planarization lens layer is between the double-sided spherical lens and the color filter layer.

4. The image sensor of claim 1, wherein a diameter of a bottom surface of the upper spherical lens is less than a diameter of a top surface of the lower spherical lens, and
an outer diameter of a bottom surface of the cover lens is substantially equal to the diameter of the top surface of the lower spherical lens.

5. The image sensor of claim 1, wherein
a curvature of the lower spherical lens is different from a curvature of the upper spherical lens.

6. The image sensor of claim 1, wherein the color filters are separated from each other by metal grids, and
the pixels are separated from each other by pixel separation structures.

7. The image sensor of claim 1, wherein the double-sided spherical lens includes at least two of polyimide, $Al_2O_3$, SiN, SiON, SiO, $SiO_2$, HfOx, and $TiO_2$.

8. The image sensor of claim 7, wherein the planarization lens layer is below the double-sided spherical lens, and
the lower spherical lens, the intermediate lens, the upper spherical lens, and the cover lens are arranged in this order on the planarization lens layer,
wherein the planarization lens layer includes polyimide or $SiO_2$, the lower spherical lens includes one of polyimide, SiN, SiO, SiON, HfOx, and $TiO_2$, the upper spherical lens includes one of polyimide, $SiO_2$, and $Al_2O_3$, and the cover lens includes polyimide.

9. An image sensor, comprising:
a substrate which has a first surface and a second surface opposite to the first surface and pixels arranged in a two-dimensional array, wherein each of the pixels includes a photodiode;
a multi-wiring layer arranged on the first surface of the substrate;
a color filter layer arranged on the second surface of the substrate and comprising color filters that respectively correspond to the pixels;
a planarization lens layer arranged on the color filter layer; and
a double-sided spherical lens arranged on the planarization lens layer and protruding upward and downward,
wherein the double-sided spherical lens comprises a lower spherical lens and an upper spherical lens, and
a refractive index of the planarization lens layer is less than a refractive index of the upper spherical lens, and the refractive index of the upper spherical lens is less than a refractive index of the lower spherical lens,
wherein the double-sided spherical lens further comprises: a cover lens having a uniform thickness and covering the upper spherical lens; and an intermediate lens having a uniform thickness and, disposed between the upper spherical lens and the lower spherical lens and between the cover lens and the lower spherical lens,
wherein a refractive index of the cover lens is less than the refractive index of the planarization lens layer.

10. The image sensor of claim 9, wherein a diameter of a bottom surface of the upper spherical lens is less than a diameter of a top surface of the lower spherical lens, and an outer diameter of a bottom surface of the cover lens is substantially equal to the diameter of the top surface of the lower spherical lens.

11. The image sensor of claim 9, wherein a curvature of the lower spherical lens is different from a curvature of the upper spherical lens.

12. The image sensor of claim 9, wherein the planarization lens layer and the double-sided spherical lens include at least three of polyimide, $Al_2O_3$, SiN, SiON, SiO, $SiO_2$, HfOx, and $TiO_2$.

13. An image sensor, comprising:
a substrate which has a first surface and a second surface opposite to the first surface and pixels arranged in a two-dimensional array, wherein each of the pixels comprises a photodiode;
a wiring layer arranged on the first surface of the substrate;
a color filter layer arranged on the second surface of the substrate and comprising color filters that respectively correspond to the pixels; and
a double-sided spherical lens arranged on the color filter layer, wherein a refractive index of a first lens of the double-sided spherical lens is less than a refractive index of a second lens of the double-sided lens,
wherein the double-sided spherical lens includes at least two of polyimide, $Al_2O_3$, SiN, SiON, SiO, $SiO_2$, HfOx and $TiO_2$,
wherein the lens layer further comprises a planarization lens layer between the double-sided lens and the color filter layer, an intermediate lens between the first lens and the second lens and a cover lens on the first lens,
wherein the planarization lens layer includes polymide or $SiO_2$, the second lens includes one of polyimide, SIN, SiO, SiON, HfOx, and $TiO_2$, the first lens includes one of polymide, $SiO_2$, and $Al_2O_3$, and the cover lens includes polyimide, and
the intermediate lens includes a material having a refractive index between a refractive index of the first lens and a refractive index of the second lens.

14. The image sensor of claim 13, wherein a refractive index of the planarization layer is less than the refractive index of the second lens of the double-sided lens.

15. The image sensor of claim 14, wherein the planarization layer comprises a recess in which the first lens of the double-sided lens is disposed.

16. The image sensor of claim 14, wherein the second lens protrudes away from the planarization layer and the first lens protrudes toward the planarization layer.

* * * * *